(12) United States Patent
Chen et al.

(10) Patent No.: US 12,439,717 B2
(45) Date of Patent: Oct. 7, 2025

(54) GRID STRUCTURE WITH AT LEAST PARTIALLY ANGLED SIDEWALLS

(71) Applicant: Taiwan Semiconductor Manufacturing Company, Ltd., Hsinchu (TW)

(72) Inventors: Wei-Lin Chen, Tainan (TW); Ching-Chung Su, Tainan (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/364,216

(22) Filed: Aug. 2, 2023

(65) Prior Publication Data

US 2024/0021635 A1  Jan. 18, 2024

Related U.S. Application Data

(62) Division of application No. 17/249,787, filed on Mar. 12, 2021, now Pat. No. 11,990,488.

(51) Int. Cl.
*H10F 39/00* (2025.01)
*H04N 25/77* (2023.01)

(52) U.S. Cl.
CPC ......... *H10F 39/8053* (2025.01); *H04N 25/77* (2023.01); *H10F 39/803* (2025.01); *H10F 39/807* (2025.01); *H10F 39/8063* (2025.01)

(58) Field of Classification Search
CPC .......... H01L 27/14689; H01L 27/1463; H01L 27/14621; H01L 27/14609; H04N 25/77
See application file for complete search history.

(56) References Cited

U.S. PATENT DOCUMENTS

| 8,477,223 B2 | 7/2013 | Itonaga | |
| 2010/0245637 A1* | 9/2010 | Itonaga | H10F 39/024 438/69 |
| 2018/0076247 A1* | 3/2018 | Pang | H10F 39/8063 |

(Continued)

OTHER PUBLICATIONS

Semiconductor lithography. Photolithography Overview. (2020). https://www.newport.com/n/photolithography-overview (Year: 2020).*

*Primary Examiner* — Christine S. Kim
*Assistant Examiner* — Cole Leon Lindsey
(74) *Attorney, Agent, or Firm* — Harrity & Harrity, LLP

(57) ABSTRACT

A grid structure in a pixel array may be at least partially angled or tapered toward a top surface of the grid structure such that the width of the grid structure approaches a near-zero width near the top surface of the grid structure. This permits the spacing between color filter regions in between the grid structure to approach a near-zero spacing near the top surfaces of the color filter regions. The tight spacing of color filter regions provided by the angled or tapered grid structure provides a greater surface area and volume for incident light collection in the color filter regions. Moreover, the width of the grid structure may increase at least partially toward a bottom surface of the grid structure such that the wider dimension of the grid structure near the bottom surface of the grid structure provides optical crosstalk protection for the pixel sensors in the pixel array.

20 Claims, 34 Drawing Sheets

(56) References Cited

U.S. PATENT DOCUMENTS

| | | | |
|---|---|---|---|
| 2019/0148431 A1* | 5/2019 | Cheng | ................ H10F 39/8063 |
| | | | 257/432 |
| 2019/0237501 A1* | 8/2019 | Mu | .................. H01L 27/14623 |
| 2022/0293652 A1 | 9/2022 | Chen et al. | |

* cited by examiner

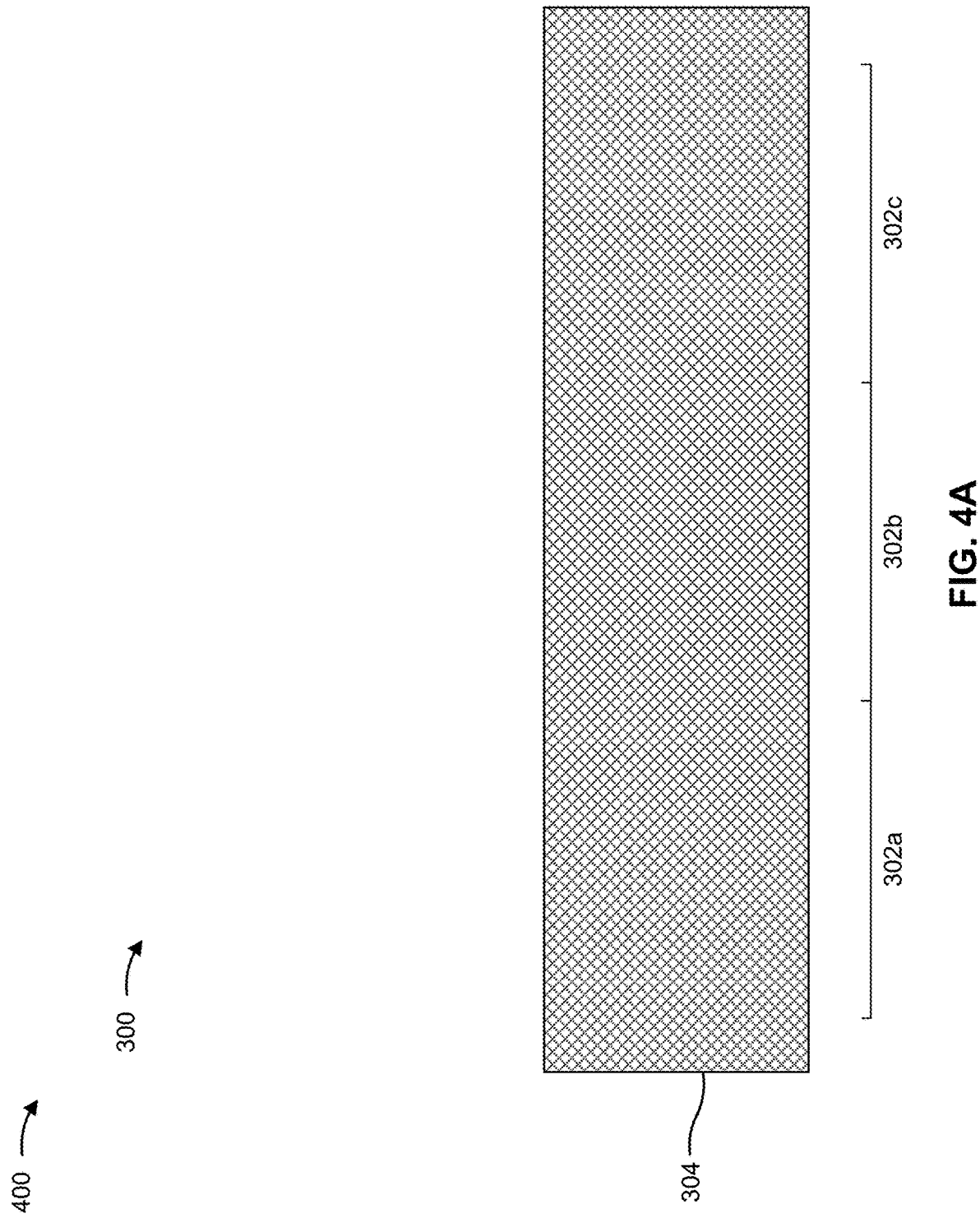

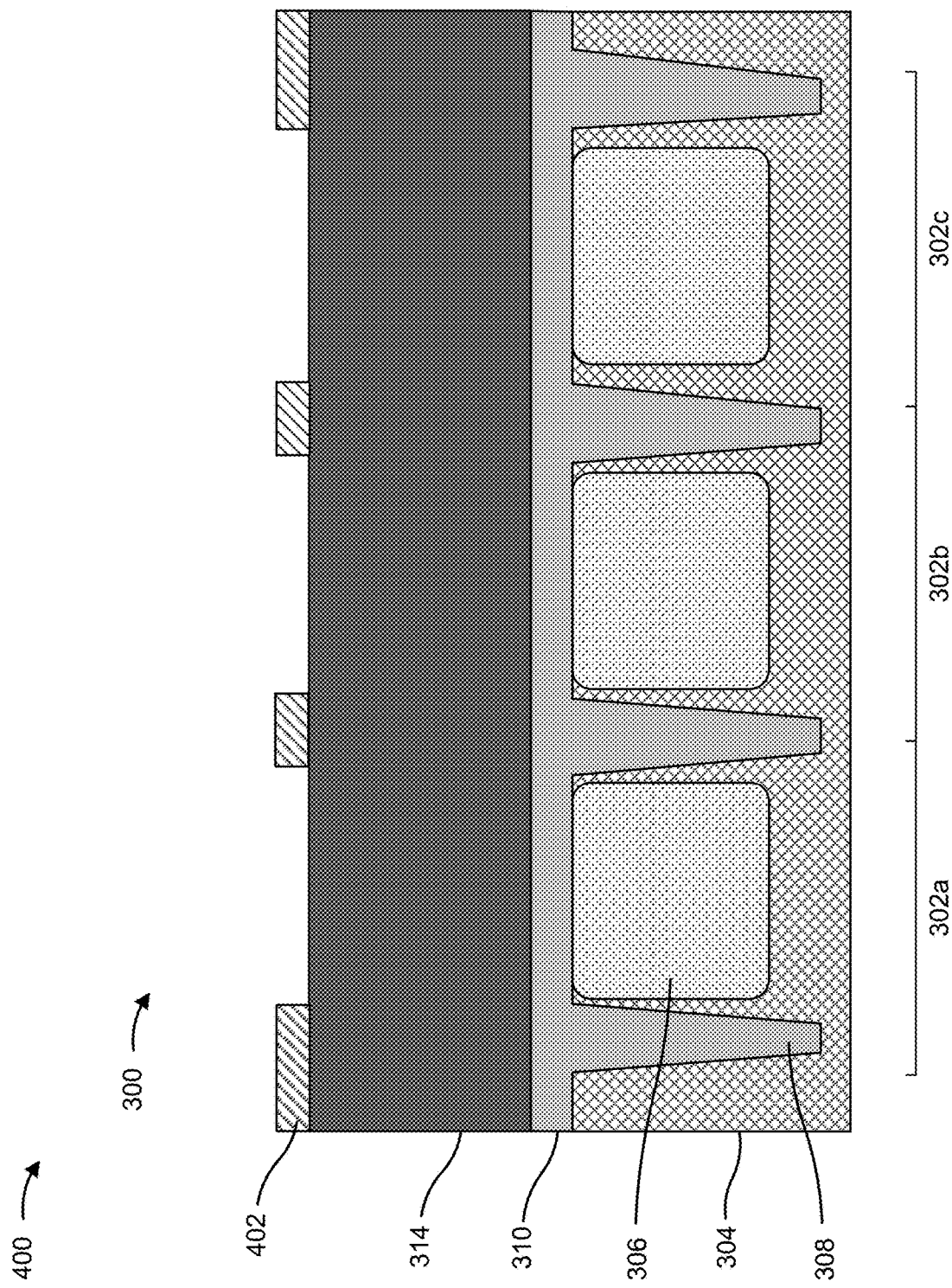

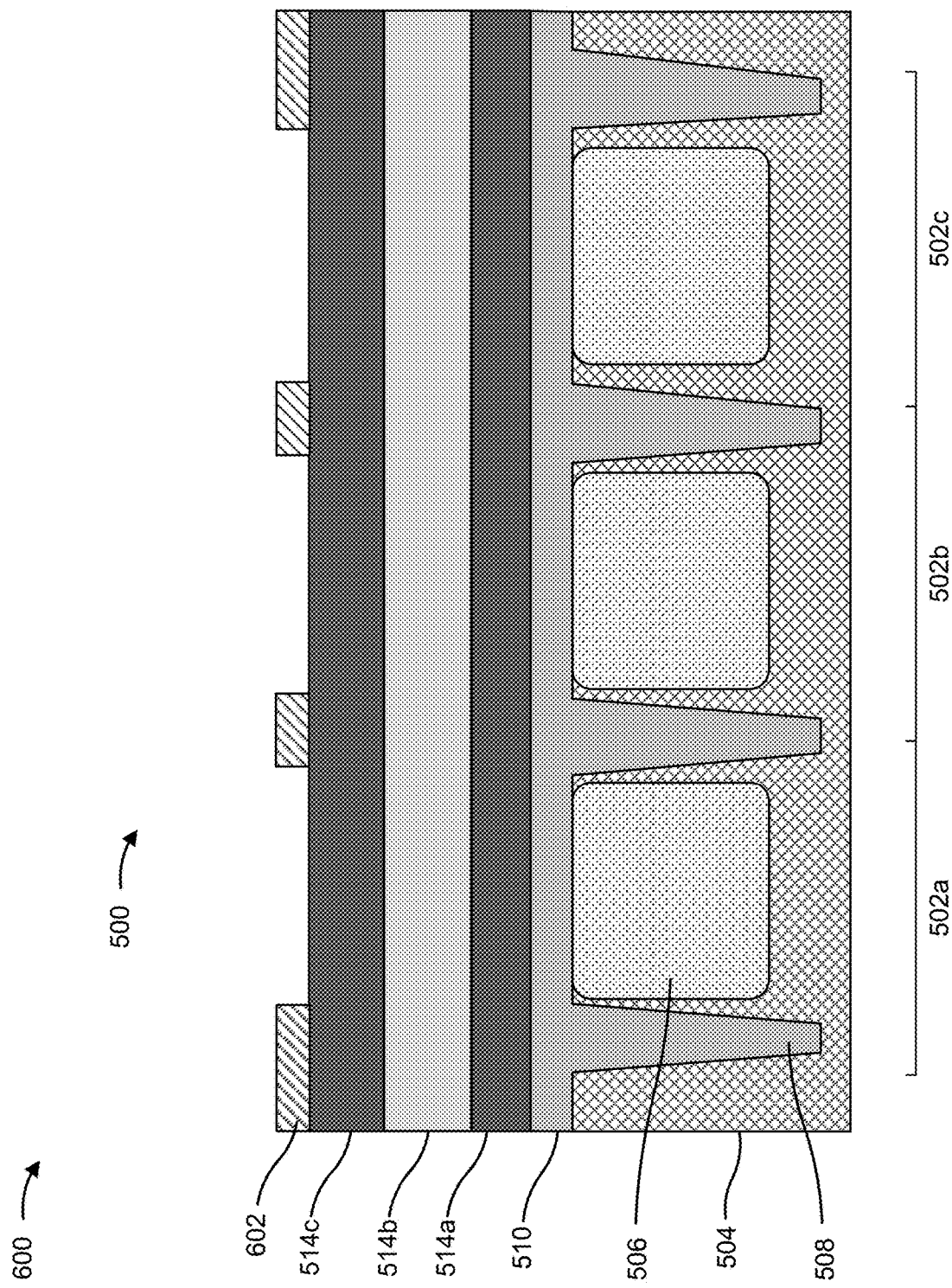

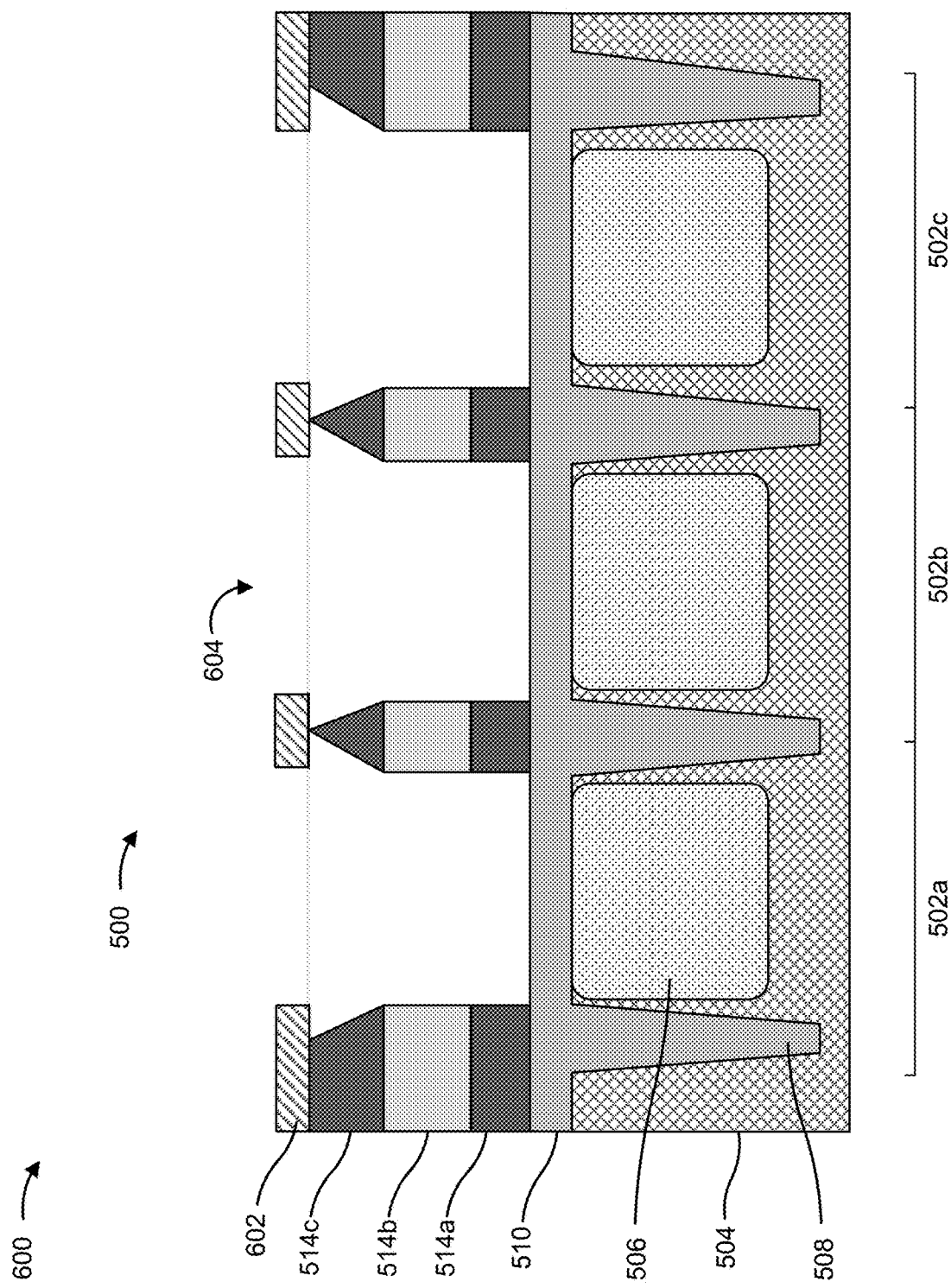

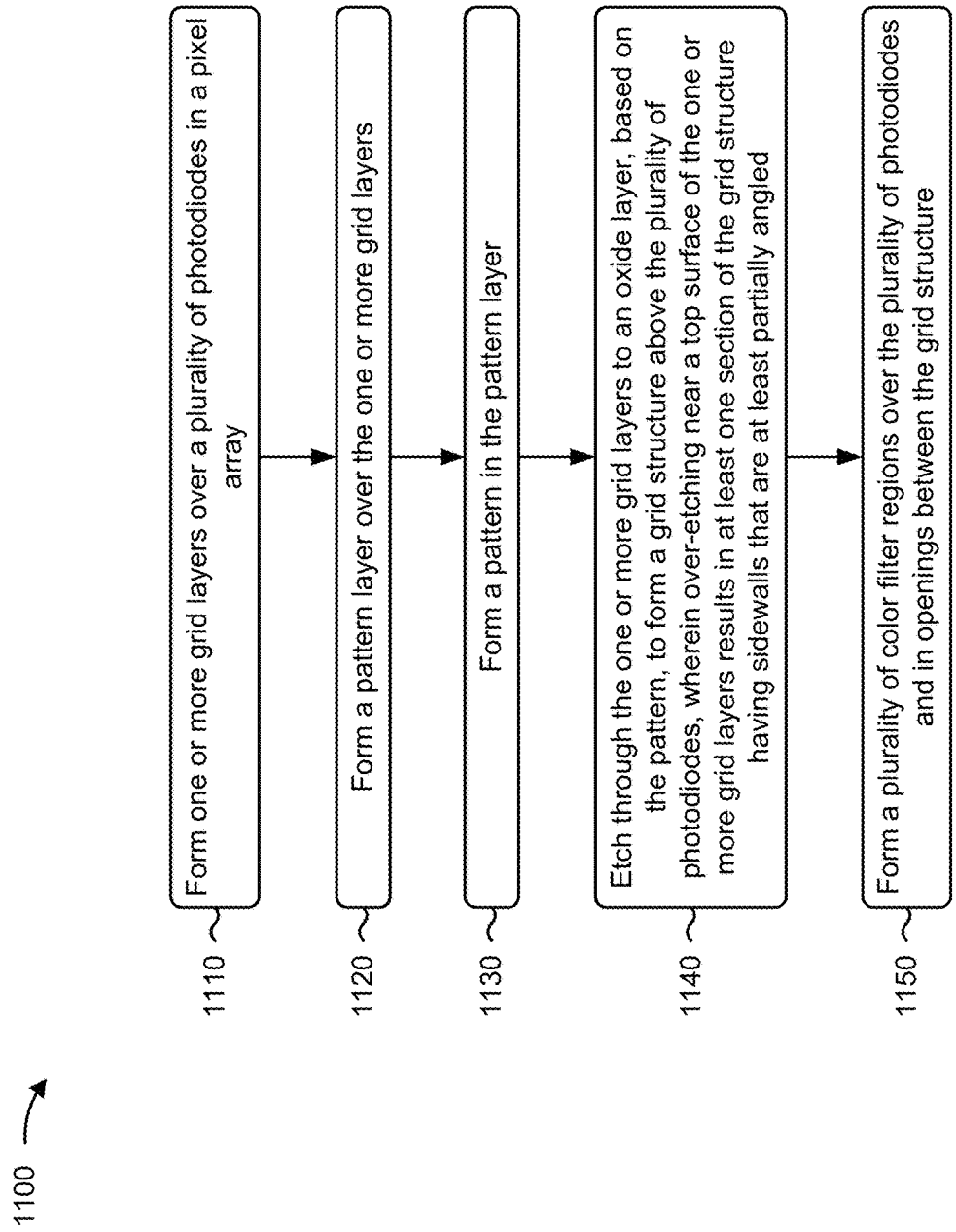

GRID STRUCTURE WITH AT LEAST PARTIALLY ANGLED SIDEWALLS

RELATED APPLICATION

This application is a division of U.S. patent application Ser. No. 17/249,787, filed Mar. 12, 2021, which is incorporated herein by reference in its entirety.

BACKGROUND

A complementary metal oxide semiconductor (CMOS) image sensor may include a plurality of pixel sensors that are configured in a pixel array. A pixel sensor of the CMOS image sensor may include a photodiode region configured to convert photons of incident light into a photocurrent of electrons, a transfer gate configured to control the flow of the photocurrent between the photodiode region and a floating diffusion region, and a drain region in the floating diffusion region configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4M are diagrams of an example implementation described herein.

FIGS. 6A-6I are diagrams of an example implementation described herein.

FIG. 11 is a flowchart of an example process relating to forming a pixel array described herein.

DETAILED DESCRIPTION

Figure 1:
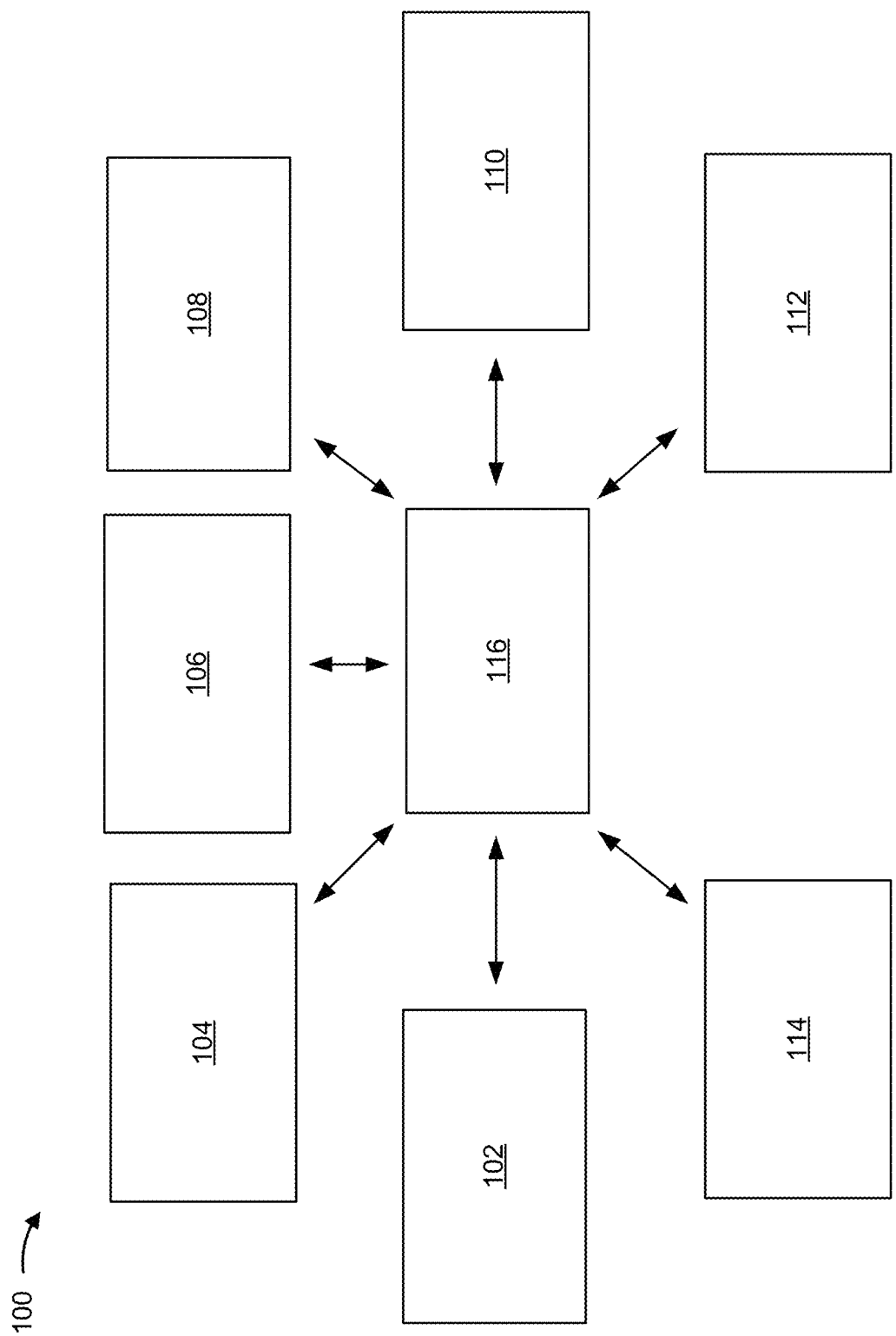
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pixel array may include a grid structure above the photodiodes of the pixel sensors in the pixel array to reduce optical crosstalk between adjacent pixel sensors. The grid structure may include columns that separate color filter regions of the pixel sensors to minimize and/or prevent incident light from traveling through a color filter region and into an adjacent color filter region or photodiode. However, the grid structure may absorb incident light and/or may reflect incident light away from the photodiodes, which may reduce the quantum efficiency of the pixel array.

Some implementations described herein provide pixel arrays that include an at least partially angled or tapered grid structure. As described herein, a grid structure in a pixel array may be at least partially angled or tapered toward a top surface of the grid structure such that the width of the grid structure approaches a near-zero width near the top surface of the grid structure. This permits the spacing between the color filter regions in between the grid structure to approach a near-zero spacing near the top surfaces of the color filter regions, which reduces and/or minimizes the spacing between color filter regions near the top surfaces of the color filter regions. The tight spacing of color filter regions provided by the angled or tapered grid structure provides a greater surface area and volume for incident light collection in the color filter regions, which may increase the quantum efficiency of the pixel array. Moreover, the width of the grid structure may increase at least partially toward a bottom surface of the grid structure such that the wider dimension of the grid structure near the bottom surface of the grid structure provides optical crosstalk protection for the pixel sensors in the pixel array.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
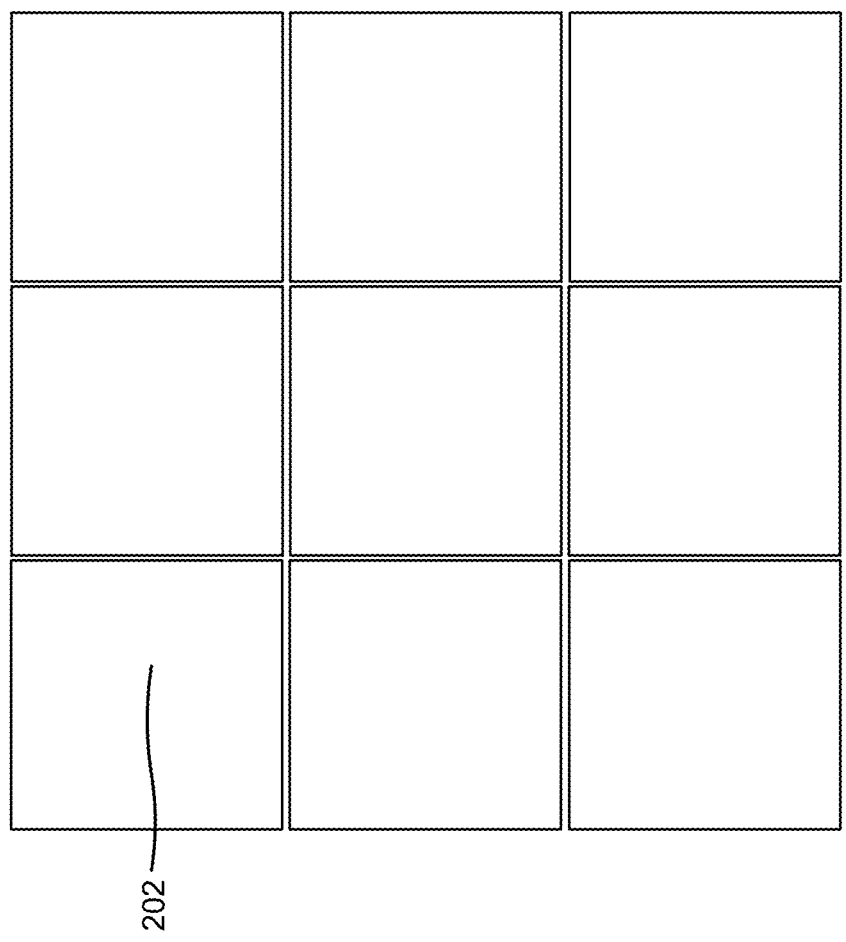
FIGS. 2 and 3A-3C are diagrams of example pixel arrays described herein.

FIG. 2 shows a top-down view of the pixel array 200. In some implementations, the pixel array 200 may be included in an image sensor. The image sensor may include a complementary metal oxide semiconductor (CMOS) image sensor, front side illuminated (FSI) CMOS image sensor, a back side illuminated (BSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3A:
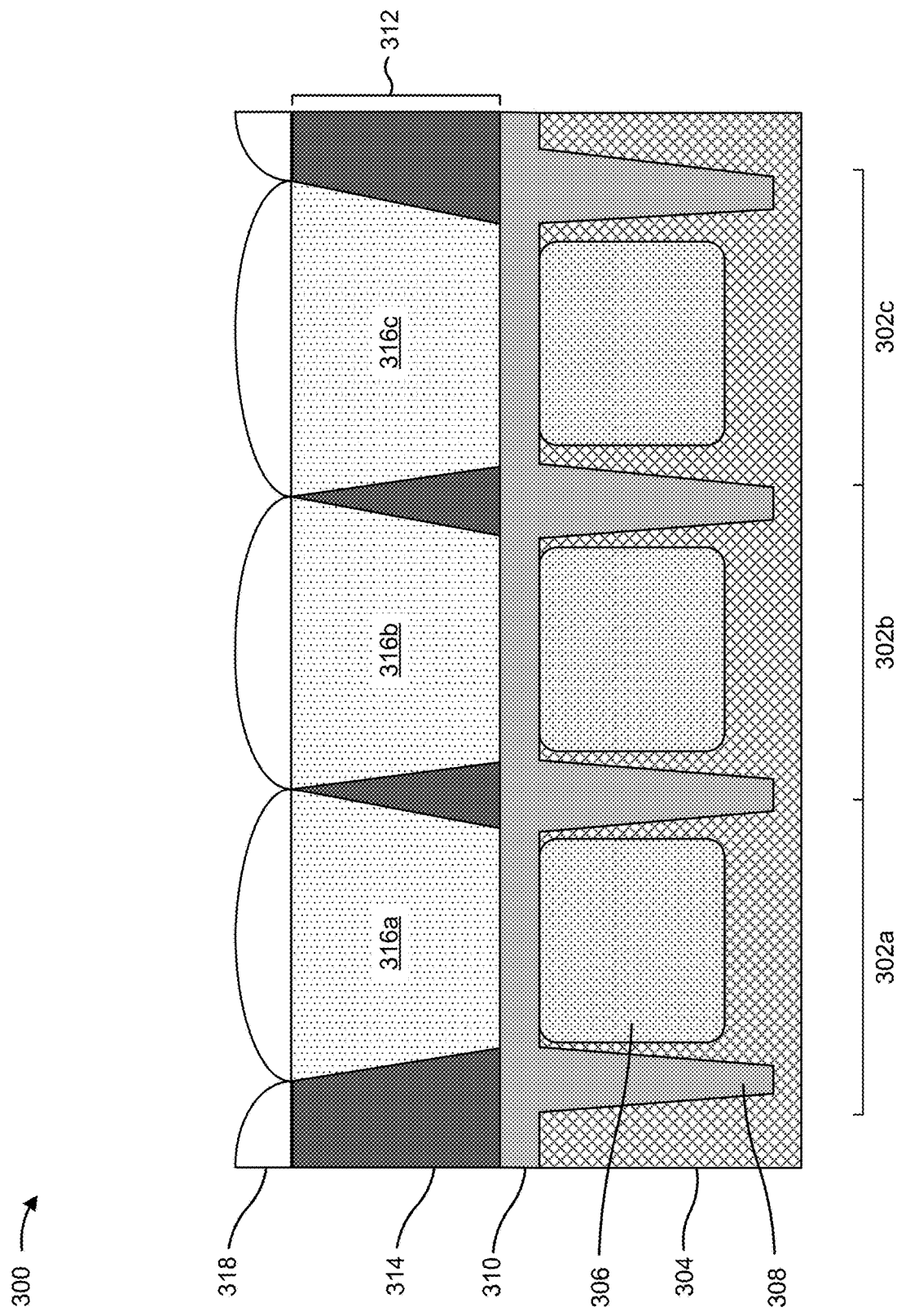
Figure 3B:
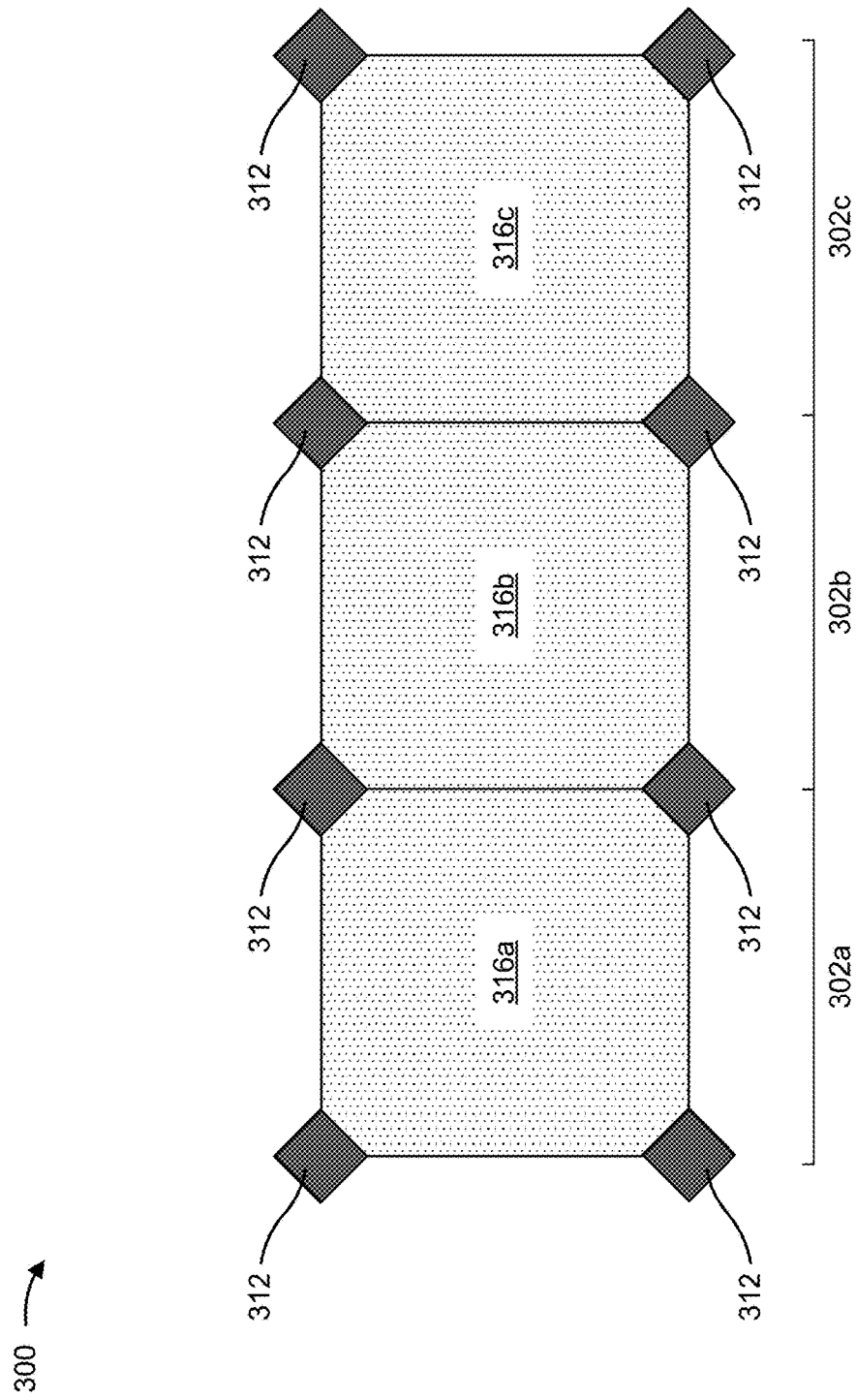
Figure 3C:
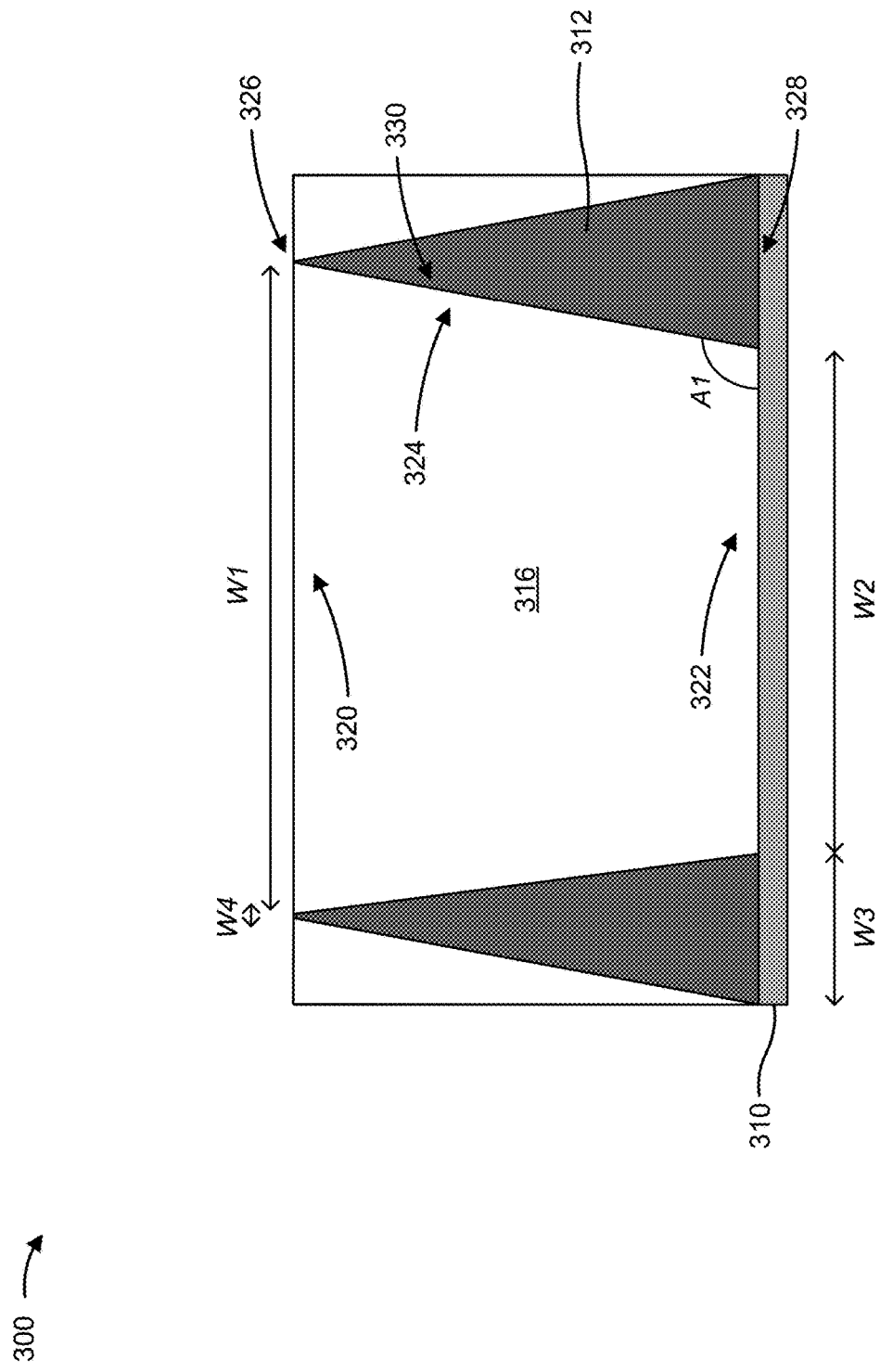

FIGS. 3A-3C are diagrams of an example pixel array 300 described herein. FIGS. 3A-3C illustrate an example in which the pixel array 300 includes a grid structure having angled sidewalls that taper (or converge) toward a top surface of the grid structure such that the width of the grid structure approaches a near-zero width near the top surface of the grid structure to reduce the spacing between the color filter regions of the pixel array 300 (which may increase the quantum efficiency of the pixel array 300). In some implementations, the pixel array 300 may include, or may be included in, the pixel array 200 (or a portion thereof). In some implementations, the pixel array 300 may be included in an image sensor. The image sensor may include a CMOS image sensor, a BSI CMOS image sensor, or another type of image sensor.

FIG. 3A illustrates a cross-sectional view of the pixel array 300 or a portion thereof. As shown in FIG. 3A, the pixel array 300 may include a plurality of adjacent pixel sensors, such as pixel sensors 302a-302c. In some implementations, the pixel sensors 302a-302c are configured as square-shaped pixel sensors 202 included in the pixel array 200. In some implementations, the pixel sensors 302a-302c include other shape(s) of pixel sensors such as octagon-shaped pixel sensors or a combination of square-shaped and octagon-shaped pixel sensors. The pixel array 300 may include a greater quantity or a lesser quantity of pixel sensors than the quantity illustrates in FIGS. 3A-3C.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

An isolation structure 308 may be included in the substrate 304 between adjacent pixel sensors 302. The isolation structure 308 may provide optical isolation by blocking or preventing diffusion or bleeding of light from one pixel sensor 302 to another pixel sensor 302, thereby reducing crosstalk between adjacent pixel sensors 302. The isolation structure 308 may include trenches or deep trench isolation (DTI) structures filled with an oxide layer 310. The isolation structure 308 may be formed in a grid layout in which the isolation structure 308 extends around the perimeters of the pixel sensors 302 in the pixel array 300 and intersects at various locations of the pixel array 300. The isolation structure 308 may extend into the substrate 304 (e.g., from a top surface of the substrate 304) to a depth such that the isolation structure 308 extends deeper than the photodiodes 306 in the substrate 304, extends to approximately the same depth as a bottom surface of the photodiodes 306, or extends to less than the depth of the bottom surface of the photodiodes 306. In some implementations, the isolation structure 308 is formed in the backside of the substrate 304 to provide optical isolation between the pixel sensors 302, and thus may be referred to as a backside DTI (BDTI) structure.

The oxide layer 310 may function as a dielectric buffer layer between the photodiodes 306 and the layers above the photodiodes 306. The oxide layer 310 may include an oxide material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), and/or another type of oxide material.

A grid structure 312 may be included over and/or on the oxide layer 310. The grid structure 312 may include a plurality of interconnected columns formed from one or more layers that are etched to form the columns. The grid structure 312 may be included above the pixel sensors 302 and may surround the perimeters of the pixel sensors 302. The grid structure 312 may be configured to provide optical isolation and additional crosstalk reduction in combination with the isolation structure 308.

The grid structure 312 may be included in a dielectric layer 314 that is located over and/or on the oxide layer 310, and thus may be referred to as an oxide grid, a dielectric grid, or a color filter in a box (CIAB) grid, among other examples. The dielectric layer 314 may include an organic material, an oxide, a nitride, and/or another type of dielectric material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), a silicon nitride ($Si_xN_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), a silicon carbide (SiC), a lanthanum aluminum oxide ($LaAlO_x$), a strontium oxide (SrO), a zirconium silicon oxide ($ZrSiO_x$), and/or a calcium oxide (CaO), among other examples.

Respective color filter regions 316 may be included in the areas between the grid structure 312. For example, a color filter region 316a may be formed in between columns of the grid structure 312 over the photodiode 306 of the pixel sensor 302a, a color filter region 316b may be formed in between columns of the grid structure 312 over the photodiode 306 of the pixel sensor 302b, a color filter region 316c may be formed in between columns of the grid structure 312 over the photodiode 306 of the pixel sensor 302c, and so on.

A refractive index of the color filter regions 316 may be greater relative to a refractive index of the grid structure 312 to increase a likelihood of a total internal reflection in the color filter regions 316 at an interface between the sidewalls of the color filter regions 316 and the sidewalls of the grid structure 312, which may increase the quantum efficiency of the pixel sensors 302.

Each color filter region 316 may be configured to filter incident light to allow a particular wavelength of the incident light to pass to a photodiode 306 of an associated pixel sensor 302. For example, the color filter region 316a included in the pixel sensor 302a may filter red light for the pixel sensor 302a (and thus, the pixel sensor 302a may be a red pixel sensor), the color filter region 316b included in the pixel sensor 302b may filter green light for the pixel sensor 302b (and thus, the pixel sensor 302b may be a green pixel sensor), the color filter region 316c included in the pixel sensor 302c may filter blue light for the pixel sensor 302c (and thus, the pixel sensor 302c may be a blue pixel sensor), and so on.

A blue filter region may permit the component of incident light near a 450 nanometer wavelength to pass through a color filter region 316 and block other wavelengths from passing. A green filter region may permit the component of incident light near a 550 nanometer wavelength to pass through a color filter region 316 and block other wavelengths from passing. A red filter region may permit the component of incident light near a 650 nanometer wavelength to pass through a color filter region 316 and block other wavelengths from passing. A yellow filter region may permit the component of incident light near a 580 nanometer wavelength to pass through a color filter region 316 and block other wavelengths from passing.

In some implementations, a color filter region 316 may be non-discriminating or non-filtering, which may define a white pixel sensor. A non-discriminating or non-filtering color filter region 316 may include a material that permits all wavelengths of light to pass into the associated photodiode 306 (e.g., for purposes of determining overall brightness to increase light sensitivity for the image sensor). In some implementations, a color filter region 316 may be an NIR bandpass color filter region, which may define a near infrared (NIR) pixel sensor. An NIR bandpass color filter region 316 may include a material that permits the portion of incident light in an NIR wavelength range to pass to an associated photodiode 306 while blocking visible light from passing.

A micro-lens layer 318 may be included above and/or on the color filter regions 316. The micro-lens layer 318 may include a respective micro-lens for each of the pixel sensors 302. For example, a micro-lens may be formed to focus incident light toward the photodiode 306 of the pixel sensor 302a, another micro-lens may be formed to focus incident light toward the photodiode 306 of the pixel sensor 302b, another micro-lens may be formed to focus incident light toward the photodiode 306 of the pixel sensor 302c, and so on.

As further shown in FIG. 3A the sidewalls of the grid structure 312 may be angled relative to the top surface of the oxide layer 310 (e.g., at a non-90-degree angle or a non-perpendicular angle) such that the sidewalls of the grid structure 312 taper or converge from a bottom surface of the grid structure 312 to a top surface of the grid structure 312. The taper between the bottom surface of the grid structure 312 and the top surface of the grid structure 312 may be continuous and gradual such that the sidewalls are approximately straight (e.g., as opposed to including breaks, curves, or direction changes) and such that the taper is uniform from the bottom surface of the grid structure 312 to the top surface of the grid structure 312. Thus, the bottom surface of the grid structure 312 is wider relative to the top surface of the grid structure 312.

The color filter regions 316 may be filled in between the grid structure 312 such that the color filter regions 316 conform to the angled or tapered sidewalls of the grid structure 312. Accordingly, the sidewalls of the color filter regions 316 may be inversely angled or tapered relative to the sidewalls of the grid structure 312 in that the sidewalls of the color filter regions 316 may taper or converge inward (e.g., toward a center of the color filter regions 316) from near the top surfaces of the color filter regions 316 to near the bottom surfaces of the color filter regions 316. Thus, the widths of the color filter regions 316 at and/or near the top surfaces of the color filter regions 316 may be greater relative to the widths of the color filter regions 316 at and/or near the bottom surfaces of the color filter regions 316.

The taper of the grid structure 312 between the bottom surface of the grid structure 312 and the top surface of the grid structure 312 provides an increased top surface area of the color filter regions 316 across which the color filter regions 316 may collect photons of incident light, which may increase the quantum efficiency of the pixel sensors 302. The increase in the width of the grid structure 312 toward the bottom surface of the grid structure 312 may provide sufficient and/or increased optical crosstalk protection for the pixel sensors 302. In some implementations, the width of the grid structure 312 approaches a near-zero width toward the top surface of the grid structure 312, which may minimize the spacing between the color filter regions 316 and may further increase the top surface area of the color filter regions 316. This may further increase the quantum efficiency of the pixel sensors 302 and may decrease the amount of incident light that is absorbed and/or reflected away from the photodiodes 306 by the grid structure 312.

FIG. 3B illustrates a top-down view of the pixel array 300 or a portion thereof. As shown in FIG. 3B, the taper or convergence of the grid structure 312 along the sides of the color filter regions 316 may result in close or tight spacing between adjacent color filter regions 316. This may increase the quantum efficiency of the pixel sensors 302 and may decrease the amount of incident light that is absorbed and/or reflected away from the photodiodes 306 by the grid structure 312. As further shown in FIG. 3B, in some implementations, the sidewalls of the grid structure 312 may be non-angled near the corners of the color filter regions 316 such that the grid structure 312 is non-tapered near the corners of the color filter regions 316. This may provide sufficient structural support and structural integrity for the grid structure 312 such that the grid structure 312 does not collapse or fail during manufacturing of the pixel array 300.

FIG. 3C illustrates various dimensional parameters of the grid structure 312 and various dimensional parameters of a color filter region 316. As shown in FIG. 3C, the color filter region 316 may include a top surface 320, a bottom surface 322, and a plurality of sidewalls 324. The top surface 320 may face toward the micro-lens layer 318, and the bottom surface 322 may face toward the photodiode 306 of the pixel sensor 302 in which the color filter region 316 is included. The grid structure 312 may include a top surface 326, a bottom surface 328, and a plurality of sidewalls 330. The top surface 326 of the grid structure 312 may be located near the top surface 320 of the color filter region 316, the bottom surface 328 of the grid structure 312 may be located near the bottom surface 322 of the color filter region 316, and the sidewalls 330 of the grid structure 312 may interface with the sidewalls 324 of the color filter region 316.

As further shown in FIG. 3C, a width (W1) of the top surface 320 of the color filter region 316 may be greater relative to a width (W2) of the bottom surface 322 of the color filter region 316. The width (W1) of the top surface 320 being greater relative to the width (W2) of the bottom surface 322 may enable the surface area of the top surface 320 in which incident light may be collected in the color filter region 316 to be increased, which may increase the quantum efficiency of the pixel sensor 302 in which the color filter region 316 is included. The width (W1) of the top surface 320 may be in a range of approximately 0.4 microns to approximately 4 microns. The color filter region 316 may be configured such that the width (W2) of the bottom surface 322 of the color filter region 316 approximately overlaps the entire top surface area of the associated photodiode 306 to increase and/or maximize the amount of incident light that is transferred from the color filter region 316 to the associated photodiode 306. In some implementations, the width (W2) of the bottom surface 322 is in a range of approximately 0.4 microns to approximately 4 microns.

As further shown in FIG. 3C, a width (W3) of the bottom surface 328 of the grid structure 312 may be greater relative to a width (W4) of the top surface 326 of the grid structure 312 such that the sidewalls 330 are angled from the bottom surface 328 to the top surface 326, and such that grid structure 312 tapers from the bottom surface 328 to the top surface 326. An angle (A1) between the top surface of the oxide layer 310 and the sidewalls 330 (which may also correspond to the angle between the bottom surface 322 of the color filter region 316 and the sidewalls 324 of the color filter region 316) may be greater than 90 degrees such that the sidewalls 330 converge or taper from the bottom surface 328 to the top surface 326, and such that the sidewalls 324 taper or converge from the top surface 320 to the bottom surface 322. The angle (A1) may be less than or equal to approximately 120 degrees such that the bottom surface 322 of the color filter region 316 is sufficiently wide to cover approximately the entire top surface of the associated photodiode 306.

The width (W3) of the bottom surface 328 of the grid structure 312 may be in a range of approximately 50 nanometers to approximately 100 nanometers to provide sufficient structural strength and/or structural integrity for the grid structure 312 and to provide sufficient optical crosstalk protection for the pixel sensor 302. The width (W4) of the top surface 326 may be greater than 0 nanometers and less than or equal to approximately 100 nanometers to reduce and/or minimize the spacing between adjacent color filter regions 316 and to reduce and/or minimize the amount of incident light that is absorbed and/or reflected away by the grid structure 312.

As indicated above, FIGS. 3A-3C are provided as one or more examples. Other examples may differ from what is described with regard to FIGS. 3A-3C.

FIGS. 4A-4M are diagrams of an example implementation 400 described herein. Example implementation 400 may be an example process or method for forming the pixel array 300 having the angled or tapered grid structure 312 included therein to reduce and/or minimize spacing between color filter regions 316 included therein and to increase the quantum efficiency of the pixel sensors 302 included therein. In some implementations, the various example techniques and procedures described in connection with FIGS. 4A-4M may be used in connection with other pixel arrays described herein, such as the pixel array 200, the pixel array 500 described in connection with FIGS. 5A and 5B, the pixel array 700 described in connection with FIG. 7, the pixel array 800 described in connection with FIG. 8, and/or the pixel array 900 described in connection with FIG. 9.

As shown in FIG. 4A, the pixel sensors 302 (e.g., the pixel sensor 302a, the pixel sensor 302b, the pixel sensor 302c, and so on) may be formed in the substrate 304. The substrate 304 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

Figure 4B:
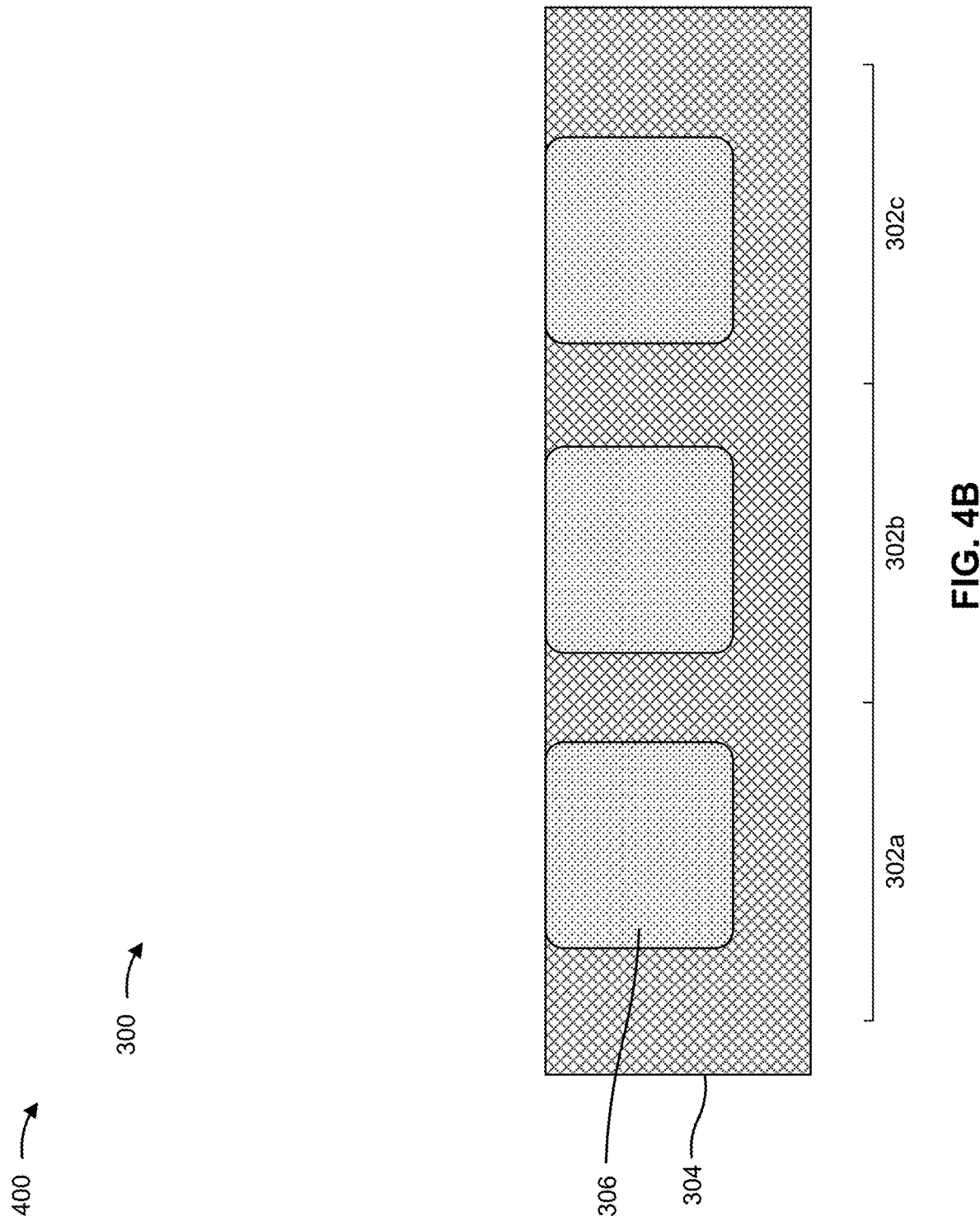

As shown in FIG. 4B, one or more semiconductor processing tools may form a plurality of photodiodes 306 in the substrate 304. For example, the ion implantation tool 114 may dope the portions of the substrate 304 using an ion implantation technique to form a respective photodiode 306 for a plurality of pixel sensors 302 (e.g., pixel sensors 302a-302c). The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

Figure 4C:
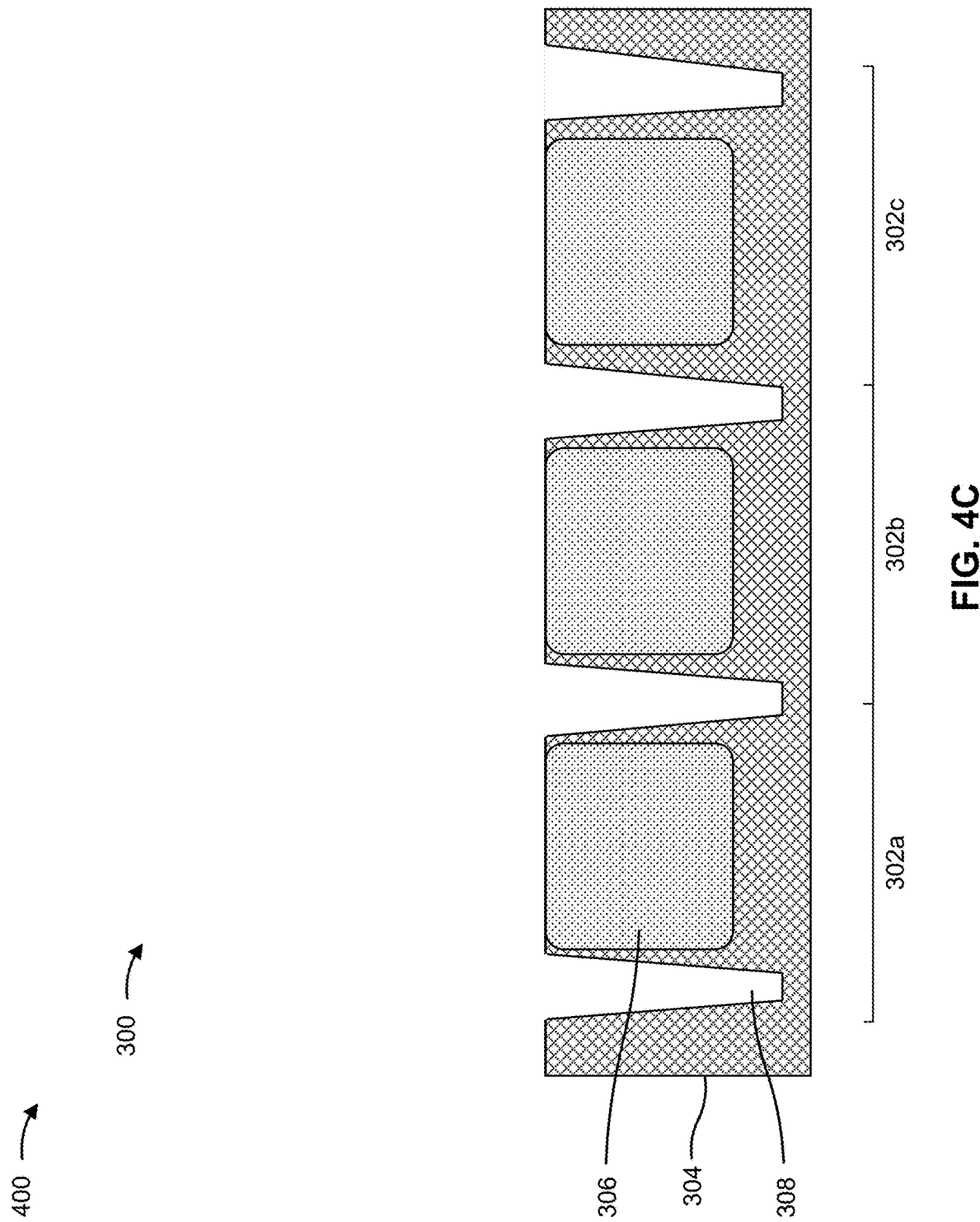

As shown in FIG. 4C, openings may be formed in the substrate 304 to form an isolation structure 308 (e.g., a DTI structure) in the substrate 304. In particular, the openings may be formed such that the isolation structure 308 may be formed between each of the photodiodes 306 of the pixel sensors 302. In some implementations, one or more semiconductor processing tools may be used to form the one or more openings for the isolation structure 308 in the substrate 304. For example, the deposition tool 102 may form a photoresist layer on the substrate 304, the exposure tool 104 may expose the photoresist layer to a radiation source to pattern the photoresist layer, the developer tool 106 may develop and remove portions of the photoresist layer to expose the pattern, and the etch tool 108 may etch portions of substrate 304 to form the openings for the isolation structure 308 in the substrate 304. In some implementations, a photoresist removal tool removes the remaining portions of the photoresist layer (e.g., using a chemical stripper and/or another technique) after the etch tool 108 etches the substrate 304.

Figure 4D:
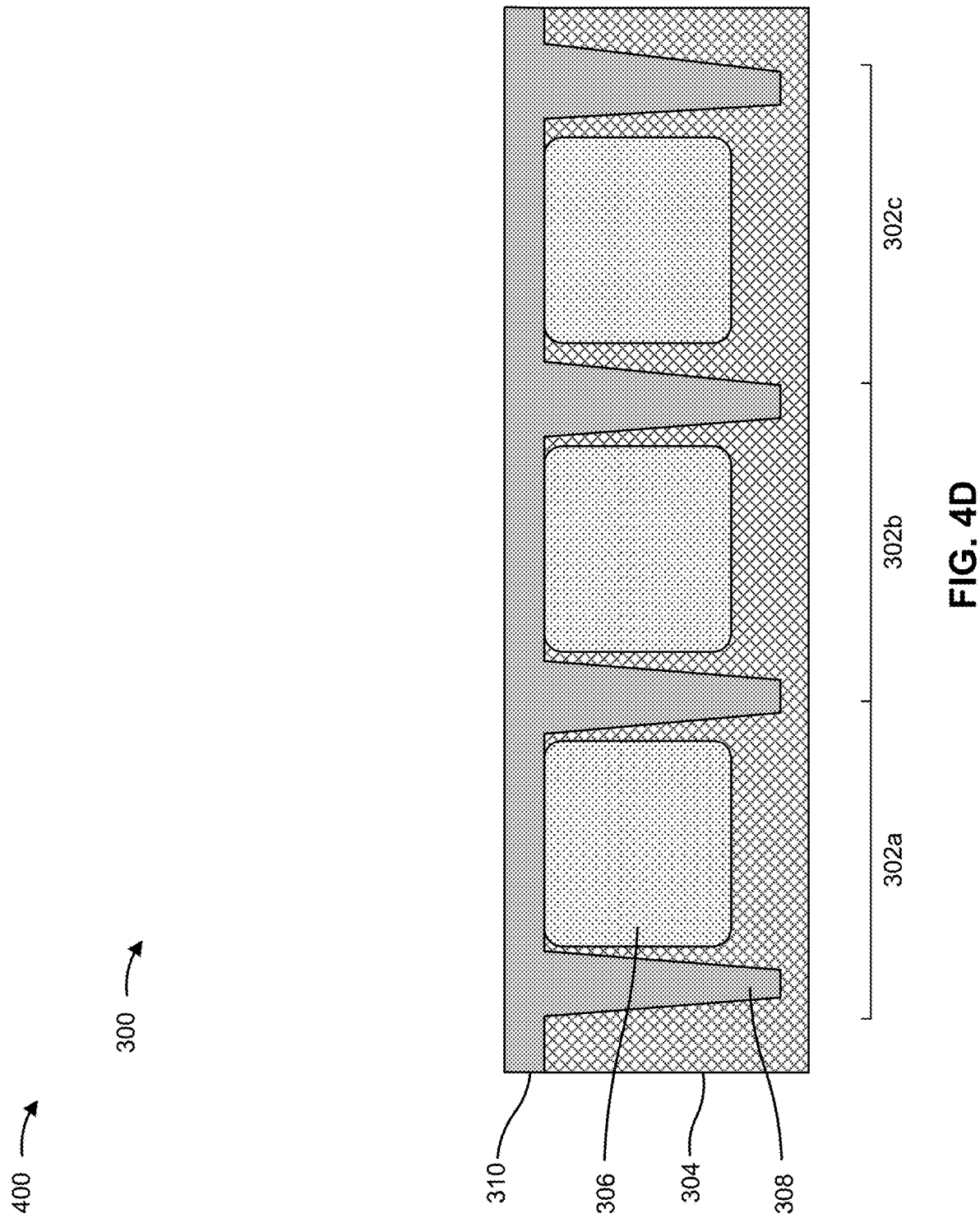

As shown in FIG. 4D, the isolation structure 308 may be filled with oxide material from the oxide layer 310. Moreover, the oxide material may continue to be formed such that the oxide layer 310 is formed over and/or on the top surface of the substrate 304, over the photodiodes 306, and over the isolation structure 308. The deposition tool 102 may deposit the oxide layer 310 using various PVD techniques, CVD techniques and/or ALD techniques, such as sputtering, PECVD, HDP-CVD, SACVD, and/or PEALD, among other examples. In some implementations, the planarization tool 110 planarizes the oxide layer 310 after the oxide layer 310 is deposited.

Figure 4E:
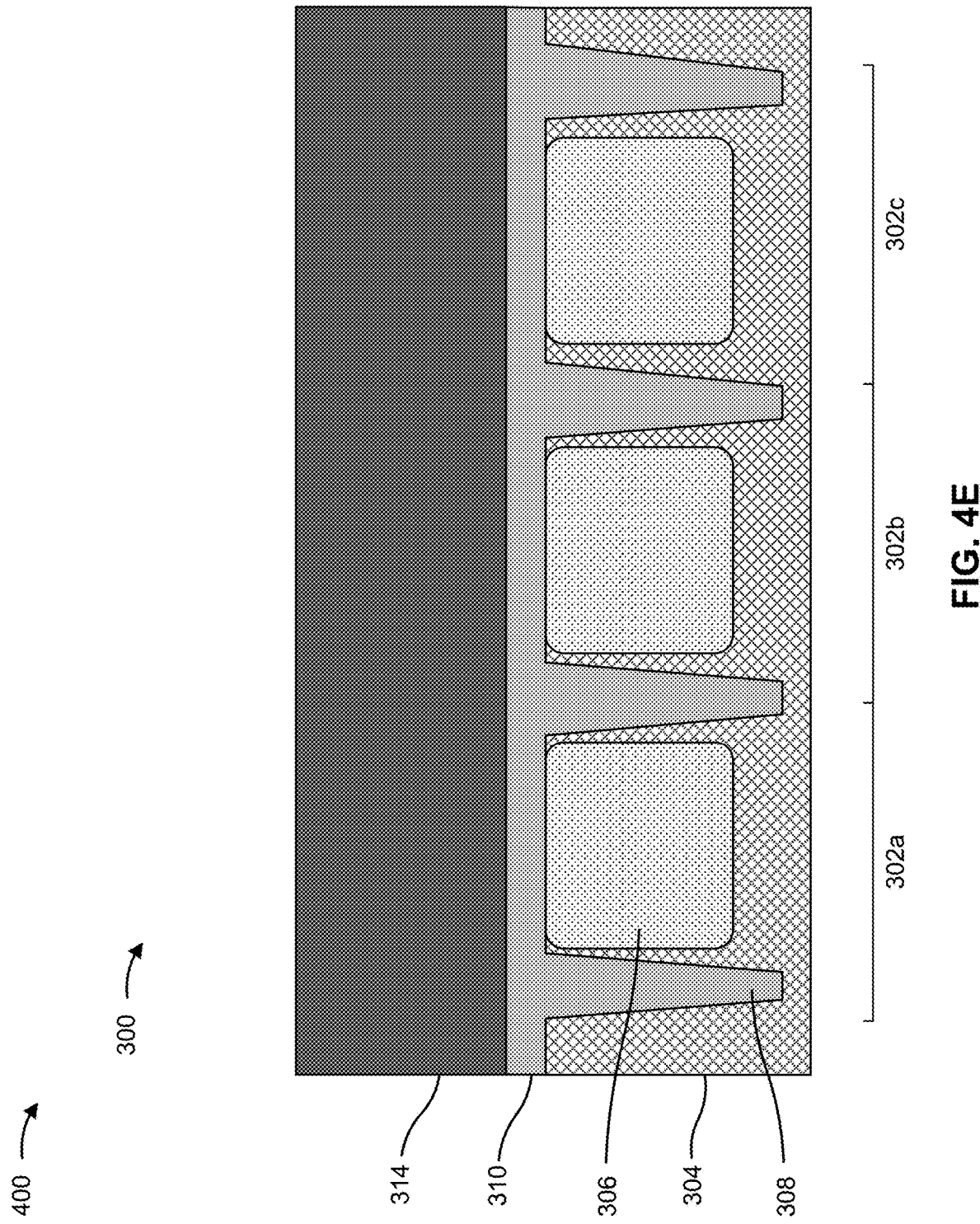

As shown in FIG. 4E, a grid layer (e.g., the dielectric layer 314) may be formed over and/or on the oxide layer 310. The deposition tool 102 may deposit the grid layer (e.g., the dielectric layer 314) using various PVD techniques, CVD techniques and/or ALD techniques, such as sputtering, PECVD, HDP-CVD, SACVD, and/or PEALD, among other examples. In some implementations, the planarization tool 110 planarizes the dielectric layer 314 after the dielectric layer 314 is deposited.

Figure 4F:
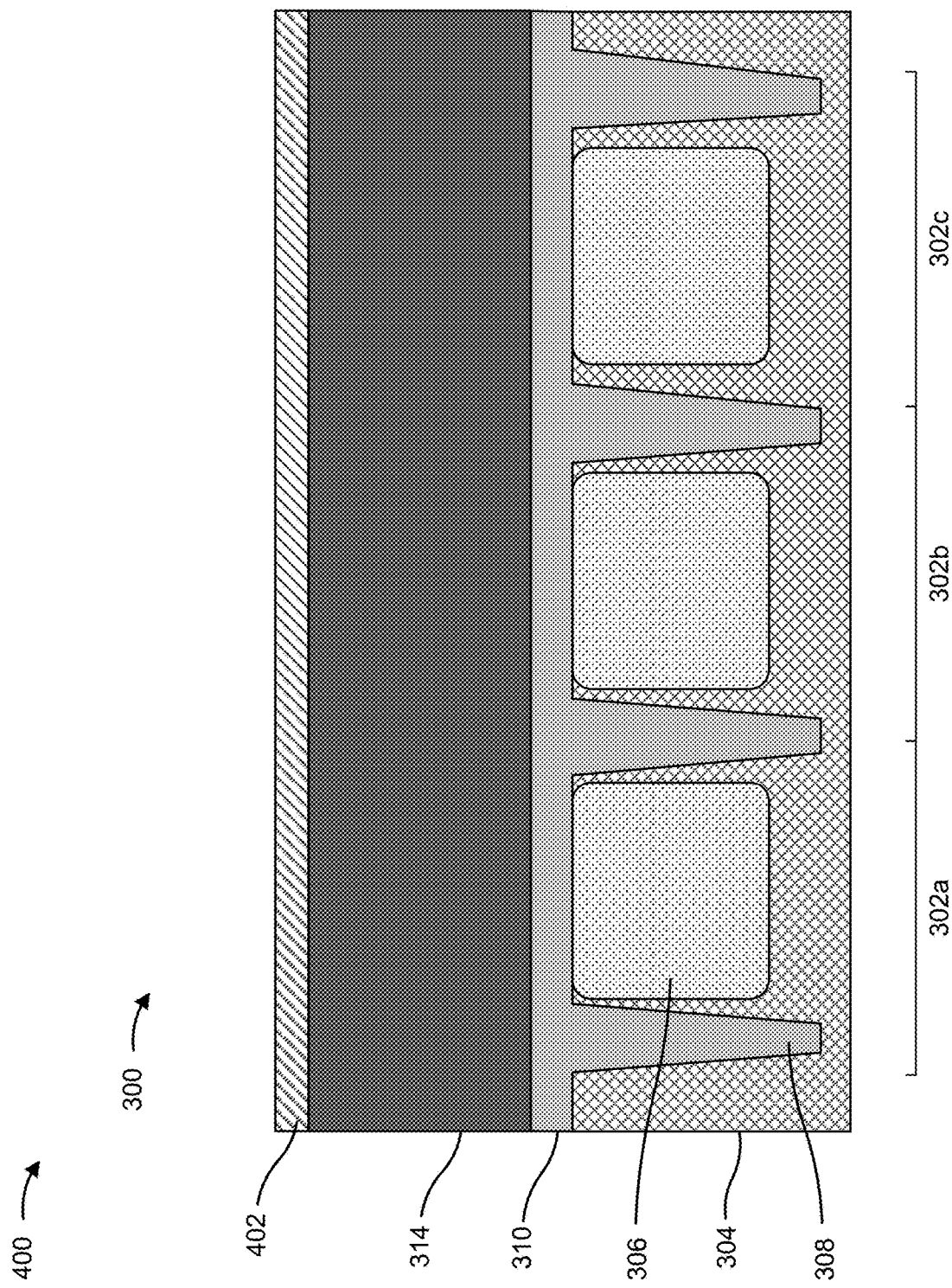

As shown in FIG. 4F, a pattern layer 402 may be formed over and/or on the dielectric layer 314. The pattern layer 402 may be used to form the grid structure 312 in the dielectric layer 314. In some implementations, the pattern layer 402 includes a photoresist, and the deposition tool 102 deposits the photoresist by a spin-coating technique. In some implementations, the pattern layer 402 includes a hard mask such as a silicon oxynitride (SiON), and the deposition tool 102 deposits the photoresist using various PVD techniques, CVD techniques and/or ALD techniques, such as sputtering, PECVD, HDP-CVD, SACVD, and/or PEALD, among other examples.

As shown in FIG. 4G, a pattern may be formed in the pattern layer 402 by removing a plurality of portions of the pattern layer 402. In some implementations, such as where the pattern layer 402 includes a photoresist, the pattern is formed by exposing the pattern layer 402 to a radiation source (e.g., using the exposure tool 104) and removing either the exposed portions or the non-exposed portions of the pattern layer 402 (e.g., using developer tool 106). In some implementations, such as where the pattern layer 402 includes a hard mask, the pattern is formed using a layer of photoresist to etch through the pattern layer 402 based on a pattern in the photoresist.

Figure 4H:
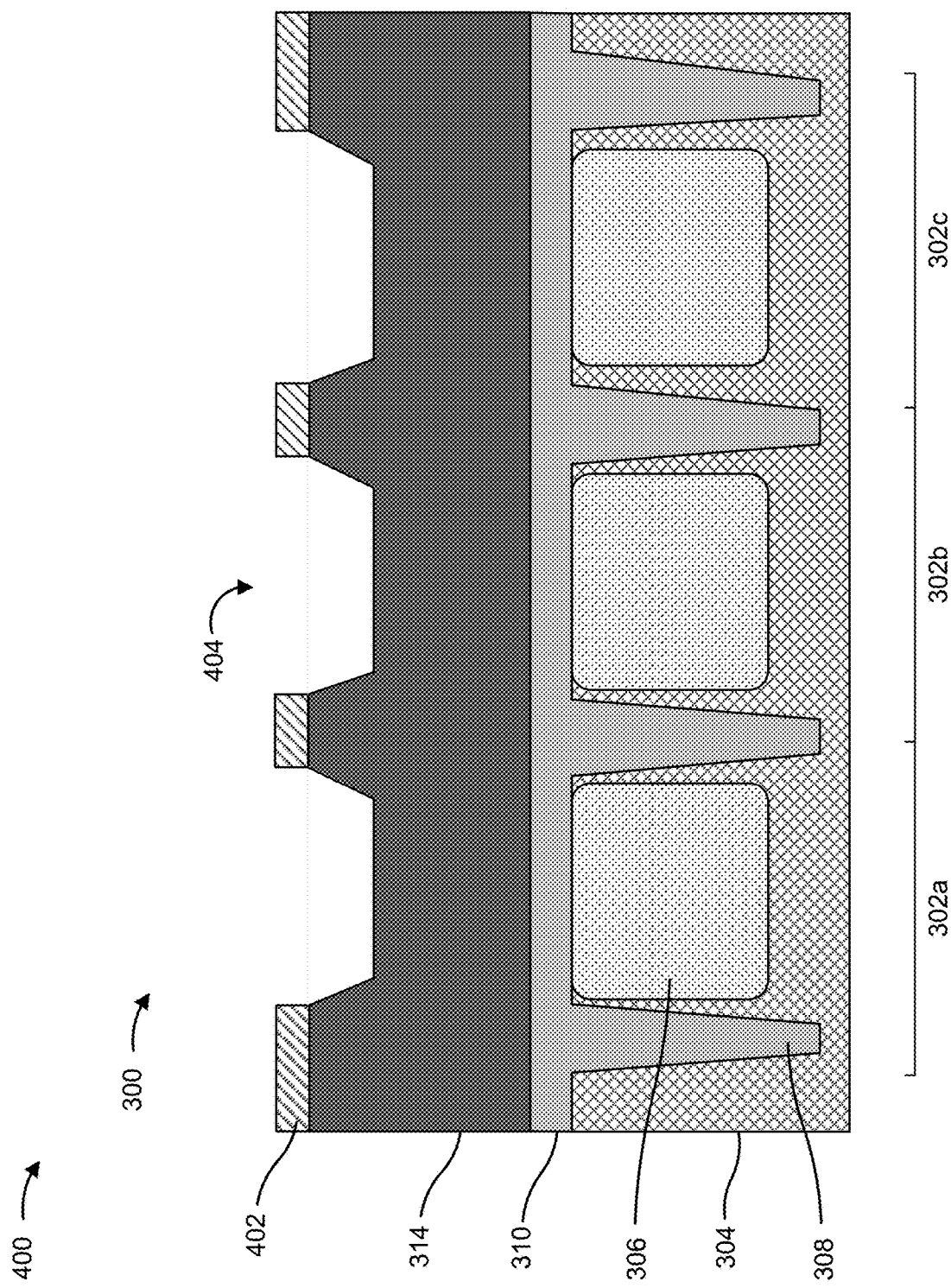
Figure 4I:
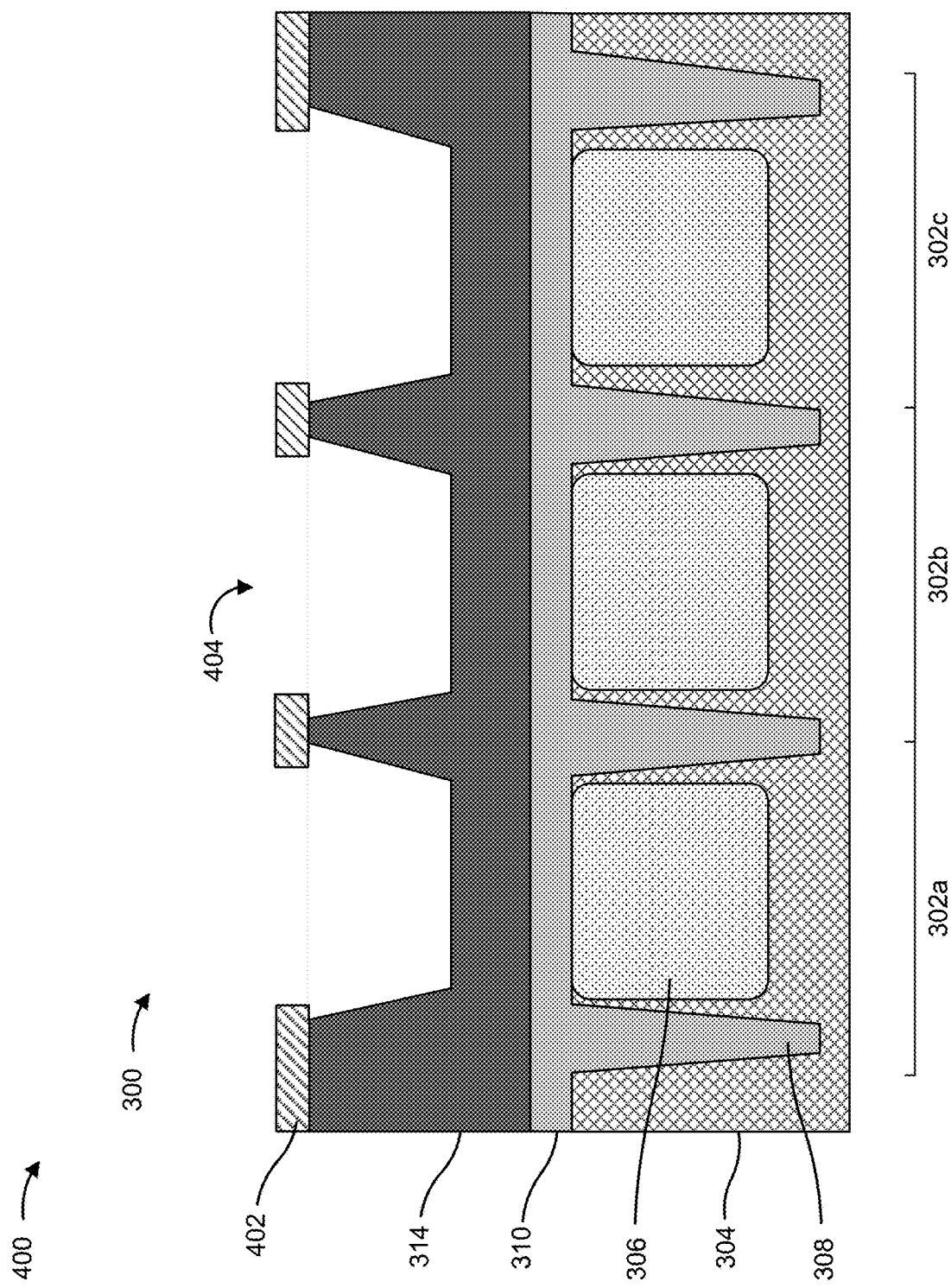
Figure 4J:
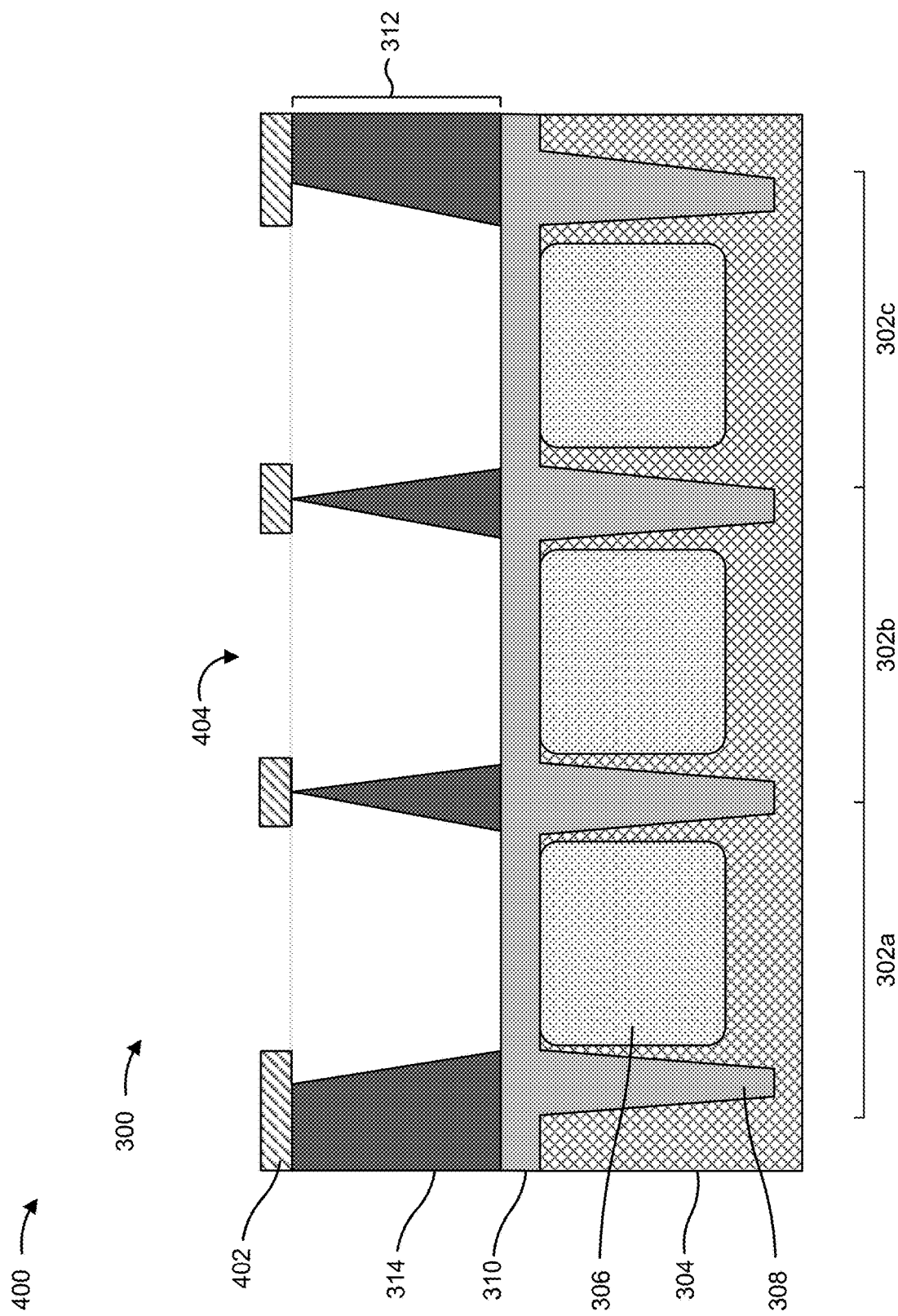

As shown in FIGS. 4H-4J, a plurality of openings 404 may be formed in the dielectric layer 314 to form the grid structure 312 in the dielectric layer 314. Etch tool 108 may etch into and through the dielectric layer 314 to the oxide layer 310 to form the openings 404 based on the pattern in the pattern layer 402. During the etching operation, over-etching may occur near the top of the openings 404 and near the top of the dielectric layer 314. Over-etching in this context may refer to the removal of material from the dielectric layer 314 from under the pattern in the pattern layer 402. The etchant that is used during the etching operation may increase the depth of the openings 404 by removing material from the dielectric layer 314 at the bottom of the openings 404. The etchant may fill the openings 404 as material is removed at the bottom to increase the depth of the openings 404. The etchant may have more time in contact with the dielectric layer 314 near the top of the dielectric layer 314 relative to the time in contact with the dielectric layer 314 near the bottom of the dielectric layer 314 since the openings 404 formed in the dielectric layer 314 from the top surface of the dielectric layer 314. The etchant laterally removes material from under the pattern in the pattern layer 402 the more time that the etchant is in contact with the sidewalls of the openings 404 near the top of the dielectric layer 314. Thus, the width of the openings 404 may continue to increase as the depth of the openings is increased, thereby resulting in over-etching near the top of the dielectric layer 314. This results in the formation of the angled or tapered sidewalls of the grid structure 312, as shown in FIG. 4J, that extend from the top surface of the grid structure 312 to the bottom surface of the grid structure 312 in a continuous and uniform manner.

Figure 4K:
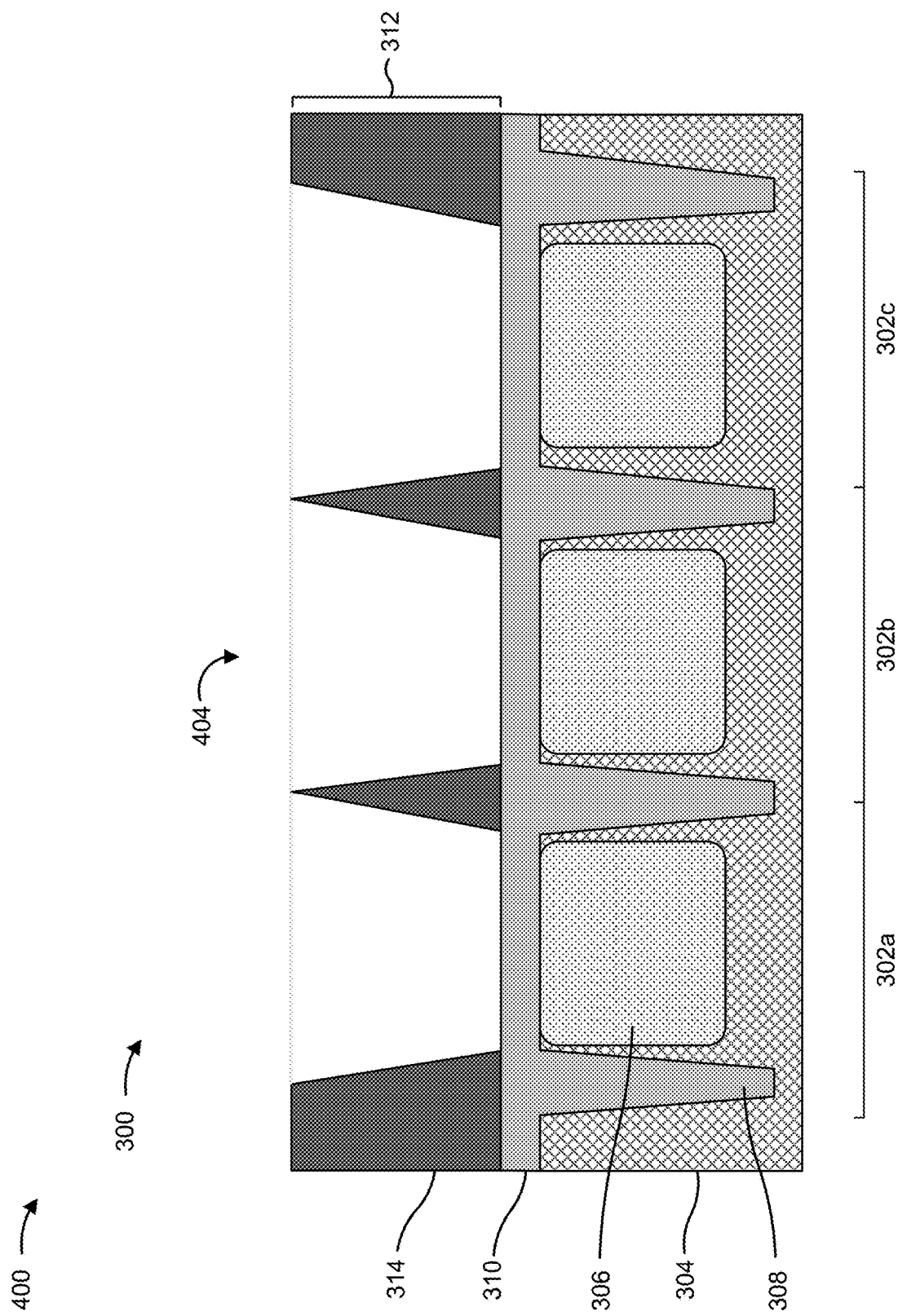

As shown in FIG. 4K the remaining portions of the pattern layer 402 may be removed from the dielectric layer 314. Various techniques may be used to remove the pattern layer 402, such as selective etching, ashing (e.g., plasma ashing), and/or photoresist stripping, among other examples.

Figure 4L:
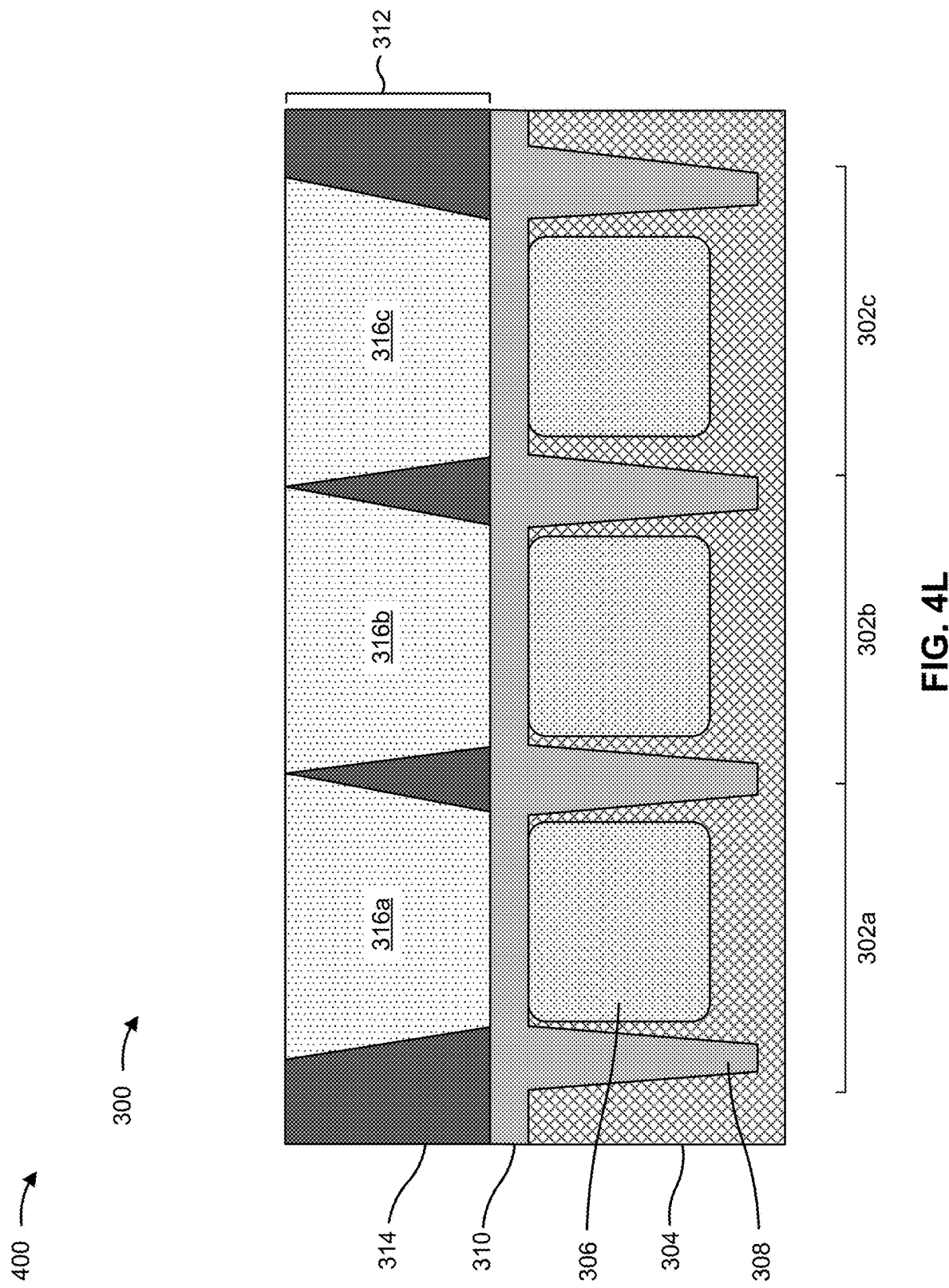

As shown in FIG. 4L, respective color filter regions 316 may be formed for each of the pixel sensors 302 in the pixel array 300 in the openings 404 in between the grid structure 312. For example, the color filter region 316a may be formed in an opening 404 above the photodiode 306 for the pixel sensor 302a, a color filter region 316b may be formed in an opening 404 above the photodiode 306 for the pixel sensor 302b, a color filter region 316c may be formed in an opening 404 above the photodiode 306 for the pixel sensor 302c, and so on. Each color filter region 316 may be formed in between the grid structure 312 to reduce color mixing between adjacent pixel sensors 302. A semiconductor processing tool (e.g., the deposition tool 102) may deposit the color filter regions 316 using various PVD techniques, CVD techniques and/or ALD techniques, such as sputtering, PECVD, HDP-CVD, SACVD, or PEALD. The color filter regions 316 may conform to the angled or tapered sidewalls of the grid structure 312 such that the sidewalls of the color filter regions 316 are also angled or tapered.

Figure 4M:
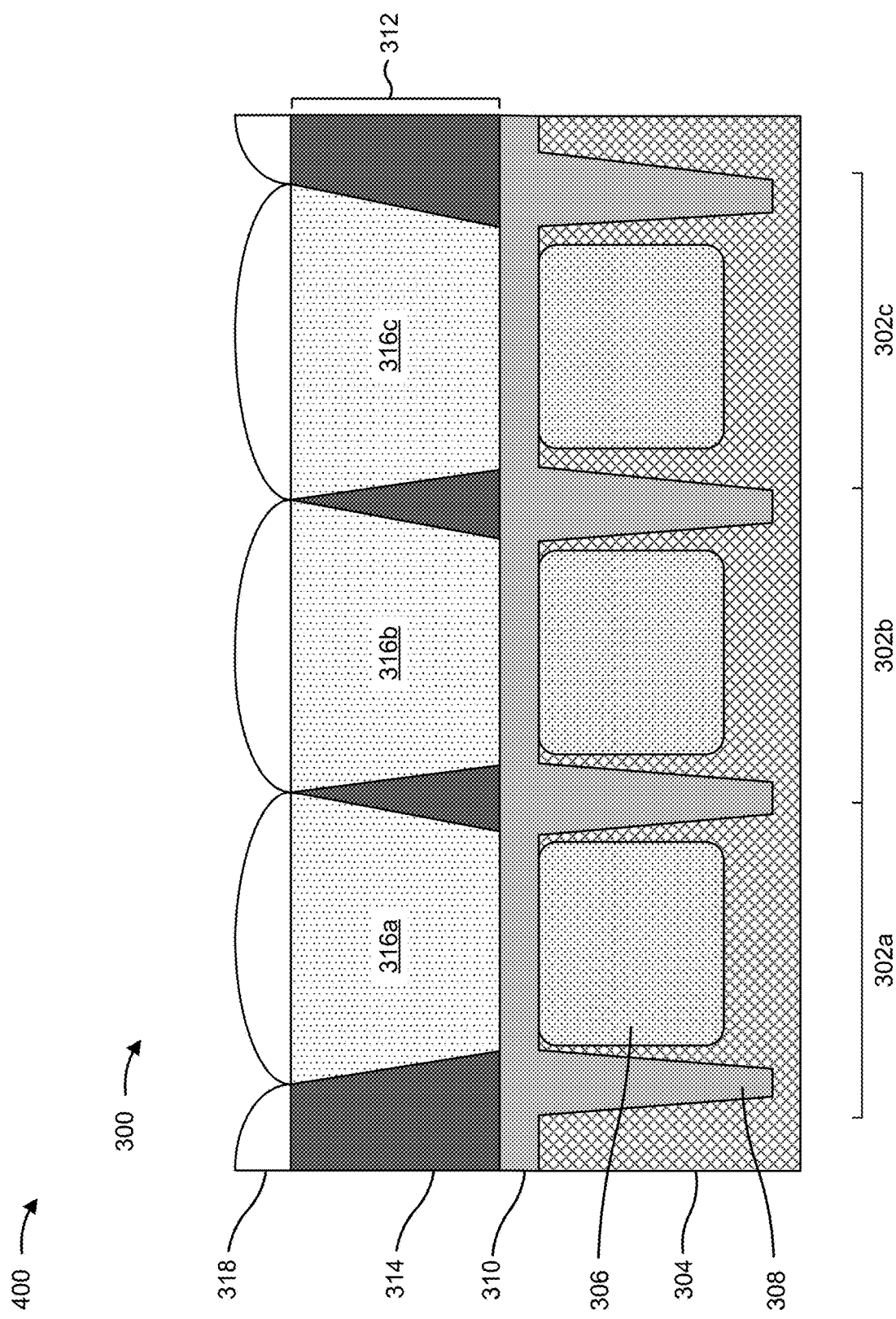

As shown in FIG. 4M, the micro-lens layer 318 including a plurality of micro-lenses is formed over and/or on the color filter regions 316. The micro-lens layer 318 may include a respective micro-lens for each of the pixel sensors 302 included in the pixel array 300. For example, a micro-lens may be formed over and/or on the color filter region 316a of the pixel sensor 302a, a micro-lens may be formed over and/or on the color filter region 316b of the pixel sensor 302b, a micro-lens may be formed over and/or on the color filter region 316c of the pixel sensor 302c, and so on.

As indicated above, FIGS. 4A-4M are provided as an example. Other examples may differ from what is described with regard to FIGS. 4A-4M.

Figure 5A:
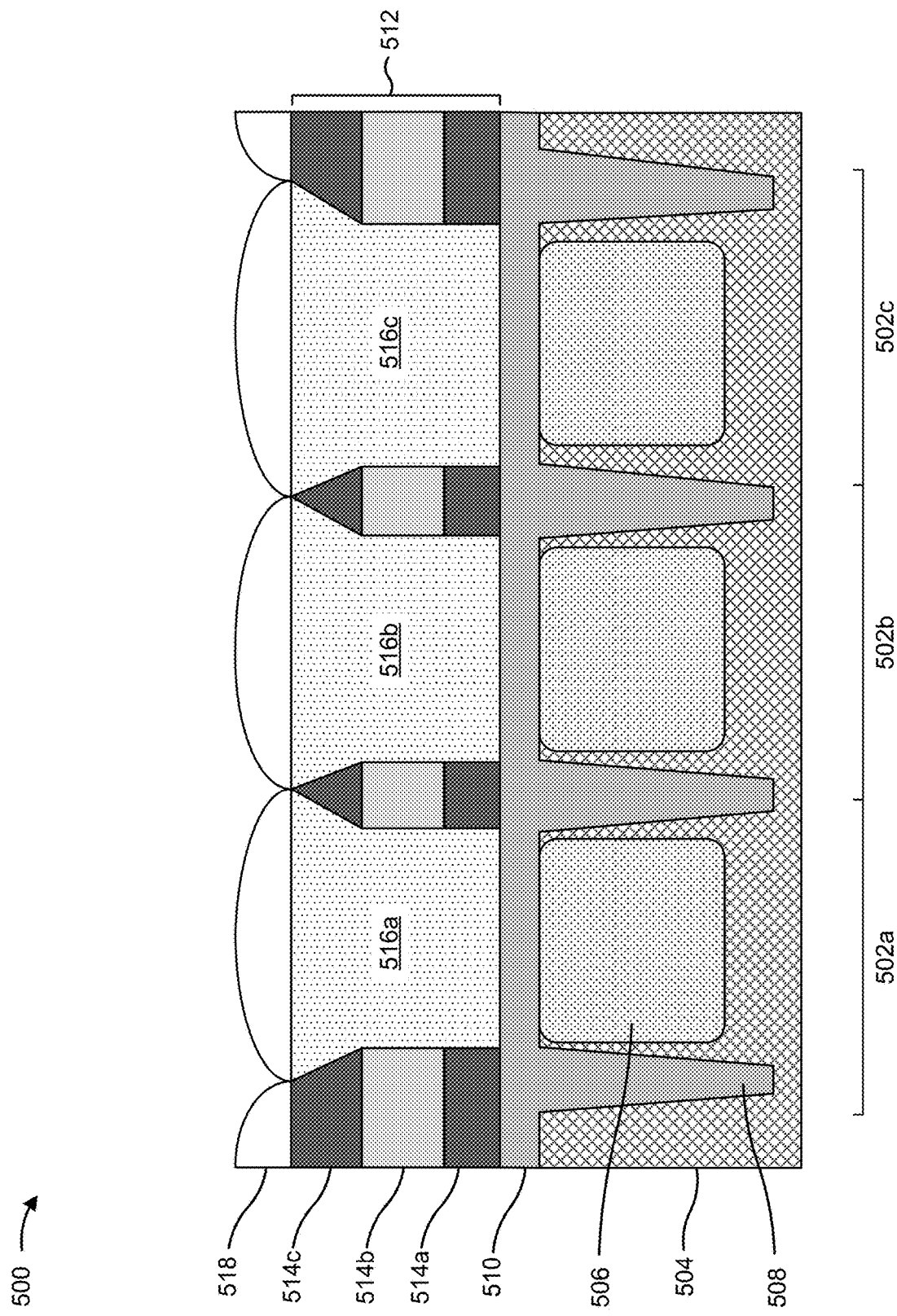
FIGS. 5A and 5B are diagrams of an example pixel array described herein.
Figure 5B:
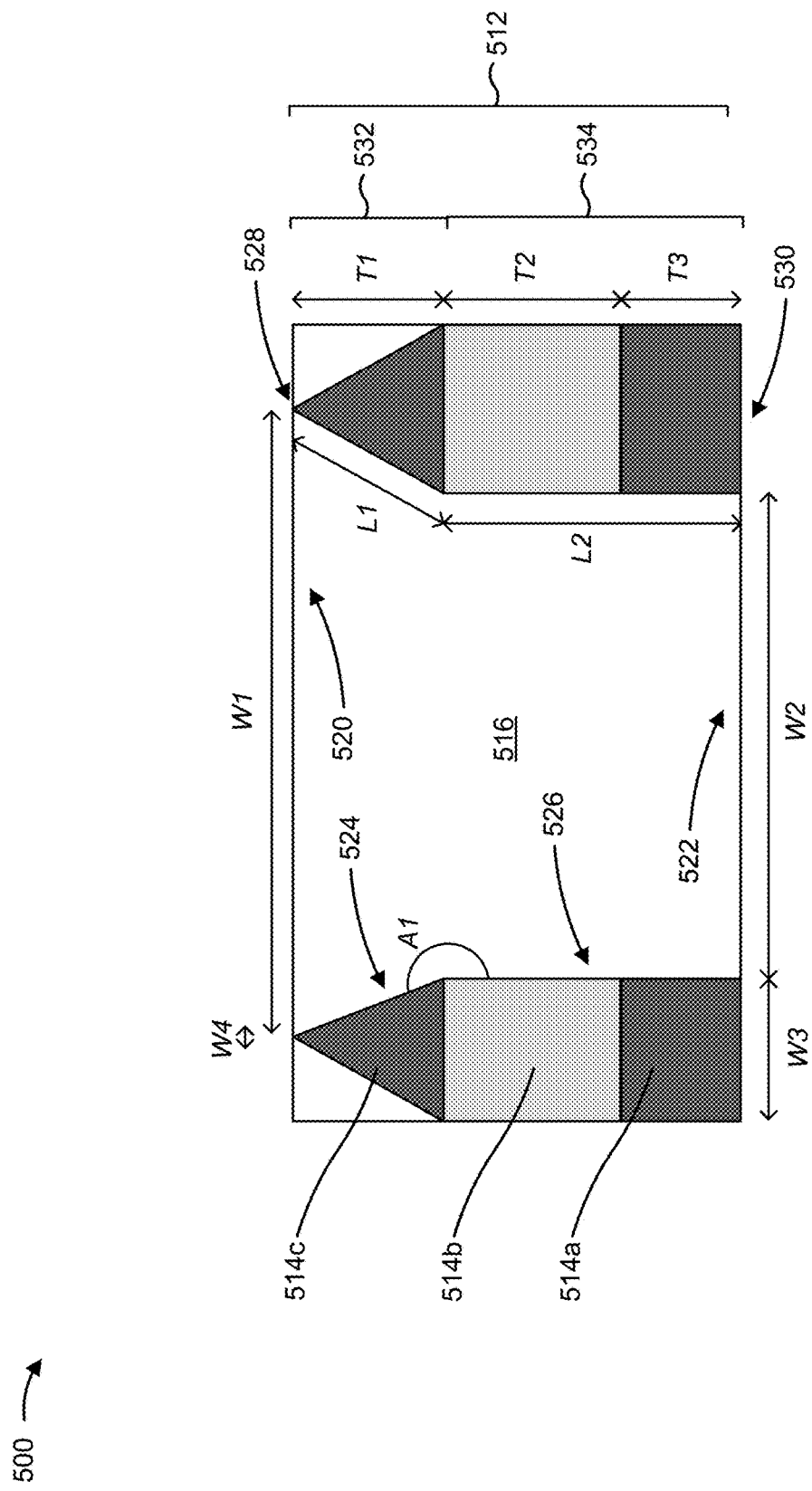

FIGS. 5A and 5B are diagrams of an example pixel array 500 described herein. The pixel array 500 may be similar to the pixel array 300 and may include similar layers and/or structures. However, the pixel array 500 includes a plurality of grid layers in which the grid structure of the pixel array 500 is formed. At least one of the grid layers may include a metal layer. Accordingly, the grid structure of the pixel array 500 may be referred to as a metal grid or a composite metal grid (CMG). The metal layer may have a different etch rate relative to other (e.g., dielectric) grid layers of the grid structure, which may result in the grid structure including an angled section and an approximately straight section.

In some implementations, the example pixel array 500 illustrated in FIG. 5A may include, or may be included in, the pixel array 200 (or a portion thereof). In some implementations, the pixel array 500 may be included in an image sensor. The image sensor may include a CMOS image sensor, an FSI CMOS image sensor, a BSI CMOS image sensor, or another type of image sensor.

As shown in FIG. 5A, the pixel array 500 may include a plurality of adjacent pixel sensors 502 formed in a substrate 504, such as pixel sensors 502a-502c. Each pixel sensor 502 may include a photodiode 506. An isolation structure 508 may be included in the substrate 504 between adjacent pixel sensors 502 and filled with an oxide layer 510. The oxide layer 510 may also be included over and/or on the top surface of the substrate 504 and over the photodiodes 506.

A grid structure 512 may be included over and/or on the oxide layer 510 and may surround the perimeters of the pixel sensors 502. The grid structure 512 may include a plurality of grid layers over and/or on the oxide layer 510, including a dielectric layer 514a, a metal layer 514b, and another dielectric layer 514c. The dielectric layers 514a and 514c may include an organic material, an oxide, a nitride, and/or another type of dielectric material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), a silicon nitride ($Si_xN_y$), a zirconium oxide (ZrO$_x$), a magnesium oxide (MgO$_x$), a yttrium oxide (Y$_x$O$_y$), a tantalum oxide (Ta$_x$O$_y$), a titanium oxide (TiO$_x$), a lanthanum oxide (La$_x$O$_y$), a barium oxide (BaO$_x$), a silicon carbide (SiC), a lanthanum aluminum oxide (LaAlO$_x$), a strontium oxide (SrO), a zirconium silicon oxide (ZrSiO$_x$), and/or a calcium oxide (CaO), among other examples. The metal layer 514b may include tungsten (W), cobalt (Co), or another type of metal or metal-containing material.

Respective color filter regions 516 may be included in the areas between the grid structure 512. For example, a color filter region 516a may be formed in between columns of the grid structure 512 over the photodiode 506 of the pixel sensor 502a, a color filter region 516b may be formed in between columns of the grid structure 512 over the photodiode 506 of the pixel sensor 502b, a color filter region 516c may be formed in between columns of the grid structure 512 over the photodiode 506 of the pixel sensor 502c, and so on. A micro-lens layer 518 may be included above and/or on the color filter regions 516. The micro-lens layer 518 may include a respective micro-lens for each of the pixel sensors 502. For example, a micro-lens may be formed to focus incident light toward the photodiode 506 of the pixel sensor 502a, another micro-lens may be formed to focus incident light toward the photodiode 506 of the pixel sensor 502b, another micro-lens may be formed to focus incident light toward the photodiode 506 of the pixel sensor 502c, and so on.

As described above, the grid structure 512 may include an angled or tapered section and an approximately straight section. In the angled or tapered section, the sidewalls of the grid structure 512 may be angled relative to the top surface of the oxide layer 510 and relative to the top surface of the grid structure 512 (e.g., at a non-90-degree angle or a non-perpendicular angle) such that the sidewalls of the grid structure 512 taper or converge through a portion of the grid structure 512 to the top surface of the grid structure 512. The taper through the portion of the grid structure 512 to the top surface of the grid structure 512 may be continuous and gradual such that the sidewalls are approximately straight (e.g., as opposed to including breaks, curves, or direction changes) and such that the taper is uniform through the portion of the grid structure 512 to the top surface of the grid structure 512. In some implementations, the angled or tapered section may be included in the dielectric layer 514c.

The sidewalls of the grid structure 512 may transition from the angled or tapered section to the approximately straight section downward toward the bottom of the grid structure 512 (and downward toward the oxide layer 510). The approximately straight section may include a section of the grid structure 512 that is approximately 90 degrees (or at an approximately perpendicular angle) relative to the top surface of the oxide layer 510. The approximately straight section may be included in the metal layer 514b and in the dielectric layer 514a, and may result from the different etch rates of the dielectric layer 514a, the dielectric layer 514c, and the metal layer 514b. In particular, the etch rate of the metal layer 514b may be lower relative to the etch rates of the dielectric layers 514a and 514c. Accordingly, the metal layer 514b may be less prone to over-etching, which may result in the approximately straight sidewalls of the grid structure 512 in the metal layer 514b. Moreover, the approximately straight sidewalls may continue to the bottom of the grid structure 512 in the dielectric layer 514a since the etchant that is used to form the grid structure 512 is in contact with the dielectric layer 514a for a relatively small amount of time and may not cause over-etching in the dielectric layer 514a.

The color filter regions 516 may be filled in between the grid structure 512 such that the color filter regions 516 conform to the angled or tapered sidewalls of the grid structure 512 in the angled or tapered section, and conform to the approximately straight sidewalls in the approximately straight section. Accordingly, the sidewalls of the color filter regions 516 may be inversely angled or tapered relative to the sidewalls of the grid structure 512 in the angled or tapered section in that the sidewalls of the color filter regions 516 may taper or converge inward (e.g., toward a center of the color filter regions 516) from near the top surfaces of the color filter regions 516 to a depth that approximately corresponds to a bottom surface of the dielectric layer 514c. Moreover, the sidewalls of the color filter regions 516 may be approximately straight through the approximately straight section of the grid structure 512.

FIG. 5B illustrates various dimensional parameters of the grid structure 512 and various dimensional parameters of a color filter region 516. As shown in FIG. 5B, the color filter region 516 may include a top surface 520 and a bottom surface 522. The top surface 520 may face toward the micro-lens layer 518, and the bottom surface 522 may face toward the photodiode 506 of the pixel sensor 502 in which the color filter region 516 is included. The grid structure 512 may include an angled sidewall portion 524, a straight sidewall portion 526, a top surface 528, a bottom surface 530. The top surface 528 of the grid structure 512 may be located near the top surface of the color filter region 516, and the bottom surface 530 of the grid structure 512 may be located near the bottom surface 522 of the color filter region 516. The sidewalls of the grid structure 512 may interface with the sidewalls of the color filter region 516. The angled sidewall portion 524 may be included in an angled or tapered section 532 of the grid structure 512, and the straight sidewall portion 526 may be included in an approximately straight section 534 of the grid structure 512.

As further shown in FIG. 5B, a width (W1) of the top surface 520 of the color filter region 516 may be greater relative to a width (W2) of the bottom surface 522 of the color filter region 516. The width (W1) of the top surface 520 being greater relative to the width (W2) of the bottom surface 522 may enable the surface area of the top surface 520 in which incident light may be collected in the color filter region 516 to be increased, which may increase the quantum efficiency of the pixel sensor 502 in which the color filter region 516 is included. The width (W1) of the top surface 520 may be in a range of approximately 0.4 microns to approximately 4 microns. The color filter region 516 may be configured such that the width (W2) of the bottom surface 522 of the color filter region 516 approximately overlaps the entire top surface area of the associated photodiode 506 to increase and/or maximize the amount of incident light that is transferred from the color filter region 516 to the associated photodiode 506. In some implementations, the width (W2) of the bottom surface 522 is in a range of approximately 0.4 microns to approximately 4 microns.

As further shown in FIG. 5B, a width (W3) of the bottom surface 530 of the grid structure 512 may be greater relative to a width (W4) of the top surface 528 of the grid structure 512 such that the angled sidewall portion 524 of the grid structure in the angled or tapered section 532 are angled inward from approximately the bottom surface of the dielectric layer 514c to the top surface 528 of the grid structure 512. In this way, the grid structure 512 tapers from the metal layer 514b to the top surface 528 in the angled or tapered section 532. An angle (A1) between the angled sidewall portion 524 (and thus, the angled or tapered section 532) and the straight sidewall portion 526 (and thus, the approximately straight section 534) may be greater than 180 degrees and less than 270 degrees such that the angled sidewall portion 524 of the grid structure 512 converges or tapers inward toward the top surface 528.

The width (W3) of the bottom surface 530 of the grid structure 512 may be in a range of approximately 50 nanometers to approximately 100 nanometers to provide sufficient structural strength and/or structural integrity for the grid structure 512 and to provide sufficient optical crosstalk protection for the pixel sensor 502. The width (W4) of the top surface 528 may be greater than 0 nanometers and less than or equal to approximately 100 nanometers to reduce and/or minimize the spacing between adjacent color filter regions 516 and to reduce and/or minimize the amount of incident light that is absorbed and/or reflected away by the grid structure 512.

A length (L1) of the angled sidewall portion 524 may be in a range of approximately 50 nanometers to approximately 8000 nanometers to connect the angled or tapered section 532 and the approximately straight section 534 while providing a sufficient width (W2) of the bottom surface 522 of the color filter region 516 to approximately overlap the entire top surface area of the associated photodiode 506. A length (L2) of the straight sidewall portion 526 may be in a range of approximately 200 nanometers to approximately 8000 nanometers. An example thickness (T1) of the dielectric layer 514c may include approximately 1500 angstroms. An example thickness (T2) of the metal layer 514b may include approximately 1600 angstroms. An example thickness (T3) of the dielectric layer may include approximately 3600 angstroms.

As indicated above, FIGS. 5A and 5B are provided as one or more examples. Other examples may differ from what is described with regard to FIGS. 5A and 5B.

Figure 6A:
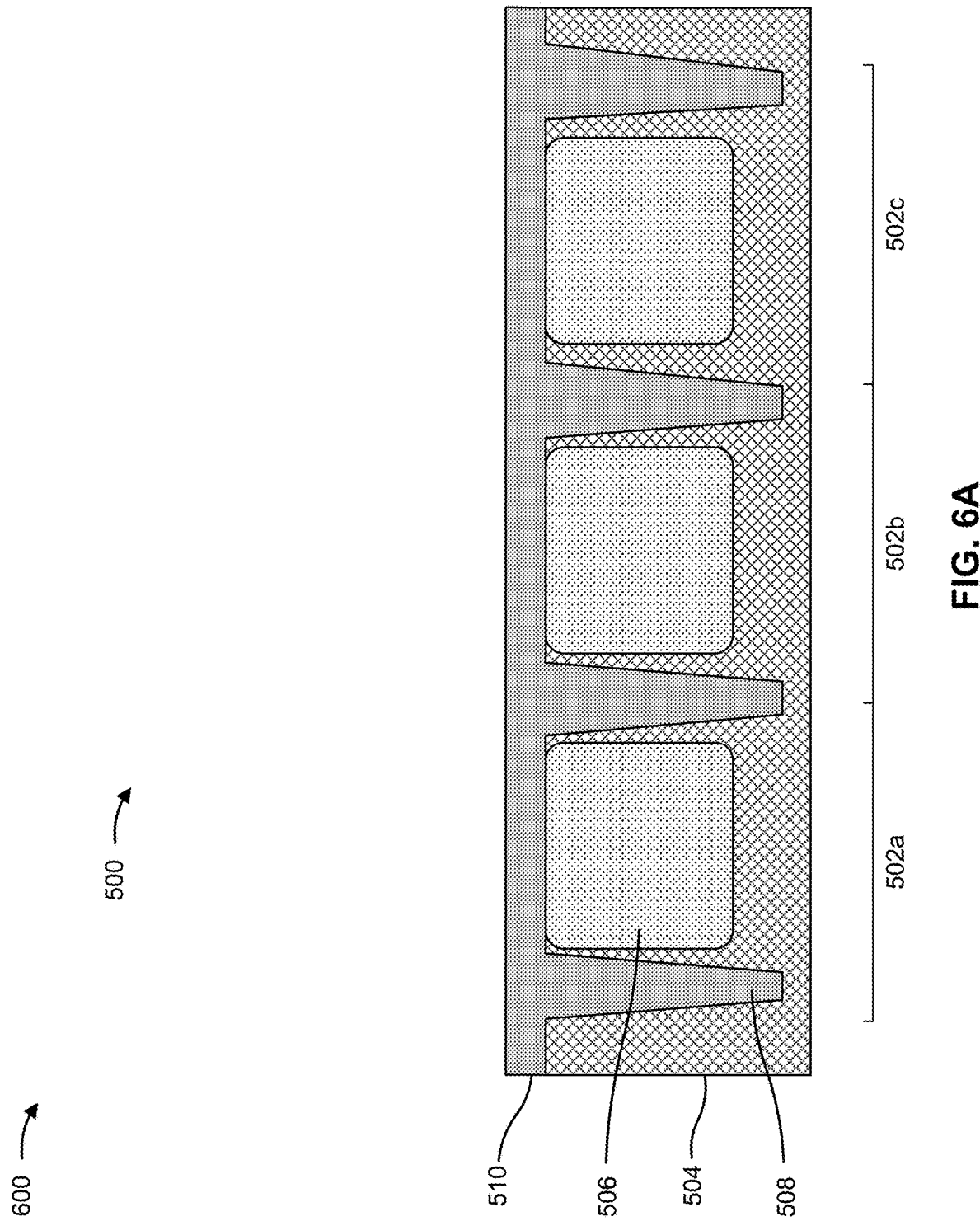

FIGS. 6A-6I are diagrams of an example implementation 600 described herein. Example implementation 600 may be an example process or method for forming the pixel array 500 including the grid structure 512 having an angled section and an approximately straight section. As shown in FIG. 6A, the photodiodes 506, the isolation structures 508, and the oxide layer 510 may be formed in a similar manner as described above in connection with FIGS. 4A-4D.

Figure 6B:
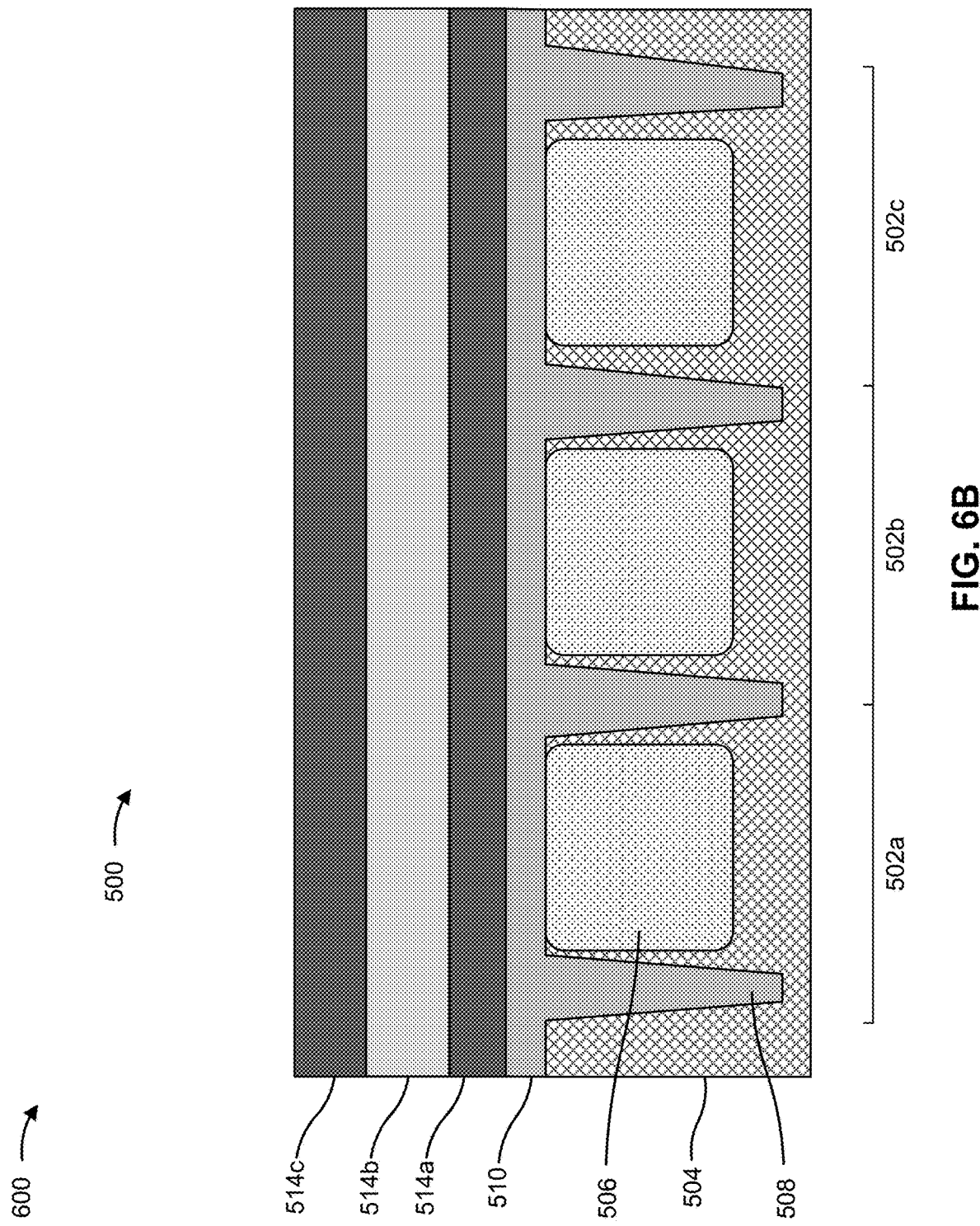

As shown in FIG. 6B, a plurality of grid layers may be formed over and/or on the oxide layer 510. For example, the dielectric layer 514a may be formed over and/or on the oxide layer 510, the metal layer 514b may be formed over and/or on the dielectric layer 514a, and the dielectric layer 514c may be formed over and/or on the metal layer 514b. The deposition tool 102 may deposit one or more of the grid layers using various PVD techniques, CVD techniques and/or ALD techniques, such as sputtering, PECVD, HDP-CVD, SACVD, and/or PEALD, among other examples, the plating tool 112 may deposit one or more of the grid layers using a plating technique (e.g., electroplating or electro-less plating), or a combination thereof. For example, the deposition tool 102 may deposit the dielectric layer 514a over and/or on the oxide layer 510, the plating tool 112 may deposit the metal layer 514b over and/or on the dielectric layer 514a, and the deposition tool 102 may deposit the dielectric layer 514c over and/or on the metal layer 514b. In some implementations, the deposition tool 102 deposits a metal seed layer onto the dielectric layer 514a, and the plating tool 112 deposits the remaining portion of the metal layer 514b onto the metal seed layer. The metal seed layer may promote adhesion between the dielectric layer 514a and the metal layer 514b, and may reduce peeling and/or delamination of the metal layer 514b. In some implementations, the planarization tool 110 planarizes each of the dielectric layer 514a, the metal layer 514b, and the dielectric layer 514c.

Figure 6C:
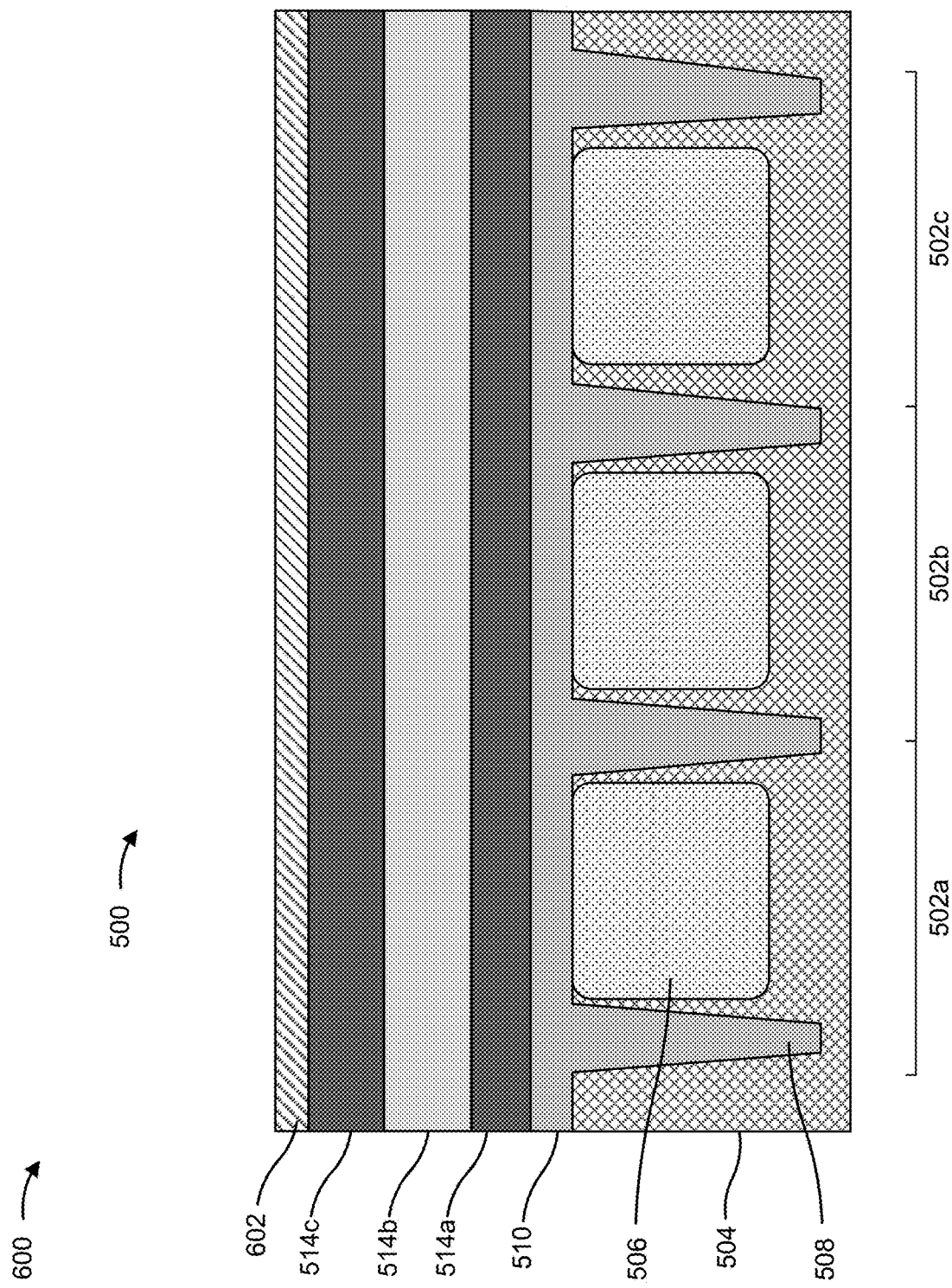

As shown in FIG. 6C, a pattern layer 602 may be formed over and/or on the dielectric layer 514c. The pattern layer 602 may be used to form the grid structure 512 in the dielectric layer 514a, in the metal layer 514b, and in the dielectric layer 514c. In some implementations, the pattern layer 602 includes a photoresist, and deposition tool 102 deposits the photoresist by a spin-coating technique. In some implementations, the pattern layer 602 includes a hard mask such as a silicon oxynitride (SiON), and the deposition tool 102 deposits the photoresist using various PVD techniques, CVD techniques and/or ALD techniques, such as sputtering, PECVD, HDP-CVD, SACVD, and/or PEALD, among other examples.

As shown in FIG. 6D, a pattern may be formed in the pattern layer 602 by removing a plurality of portions of the pattern layer 602. In some implementations, such as where the pattern layer 602 includes a photoresist, the pattern is formed by exposing the pattern 602 to a radiation source (e.g., using the exposure tool 104) and removing either the exposed portions or the non-exposed portions of the pattern layer 602 (e.g., using developer tool 106). In some implementations, such as where the pattern layer 602 includes a hard mask, the pattern is formed using a layer of photoresist to etch through the pattern layer 602 based on a pattern in the photoresist.

Figure 6E:
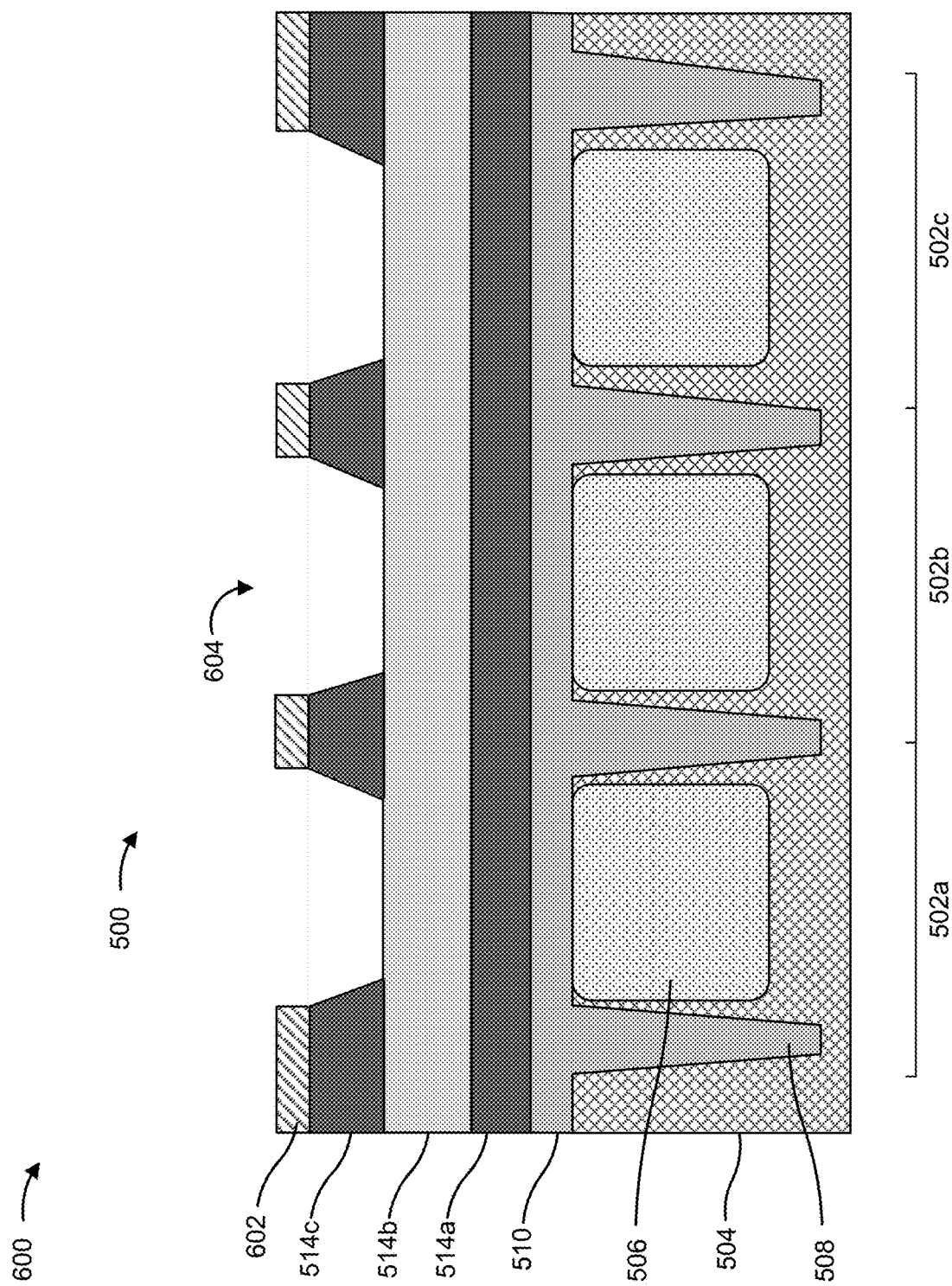

As shown in FIGS. 6E and 6F, a plurality of openings 604 may be formed in the dielectric layer 514c, the metal layer 514b, and the dielectric layer 514a to form the grid structure 512. The etch tool 108 may etch into and through the dielectric layer 514c, the metal layer 514b, and the dielectric layer 514a to the oxide layer 510 to form the openings 604 based on the pattern in the pattern layer 602. During the etching operation, over-etching may occur near the top of the openings 604 and in the dielectric layer 514c, resulting in the angled sidewall portion 524 in the angled or tapered section 532 of the grid structure 512. As the openings 604 are etched deeper and into the metal layer 514b, the etch rate or etch selectivity of the metal layer 514b may result in the formation of the straight sidewall portion 526 in the approximately straight section 534 of the grid structure 512. The straight sidewall portion 526 and the approximately straight section 534 may continue to the bottom of the grid structure 512 in the dielectric layer 514a since the etchant that is used to form the grid structure 512 is in contact with the dielectric layer 514a for a relatively small amount of time and may not cause over-etching in the dielectric layer 514a.

Figure 6G:
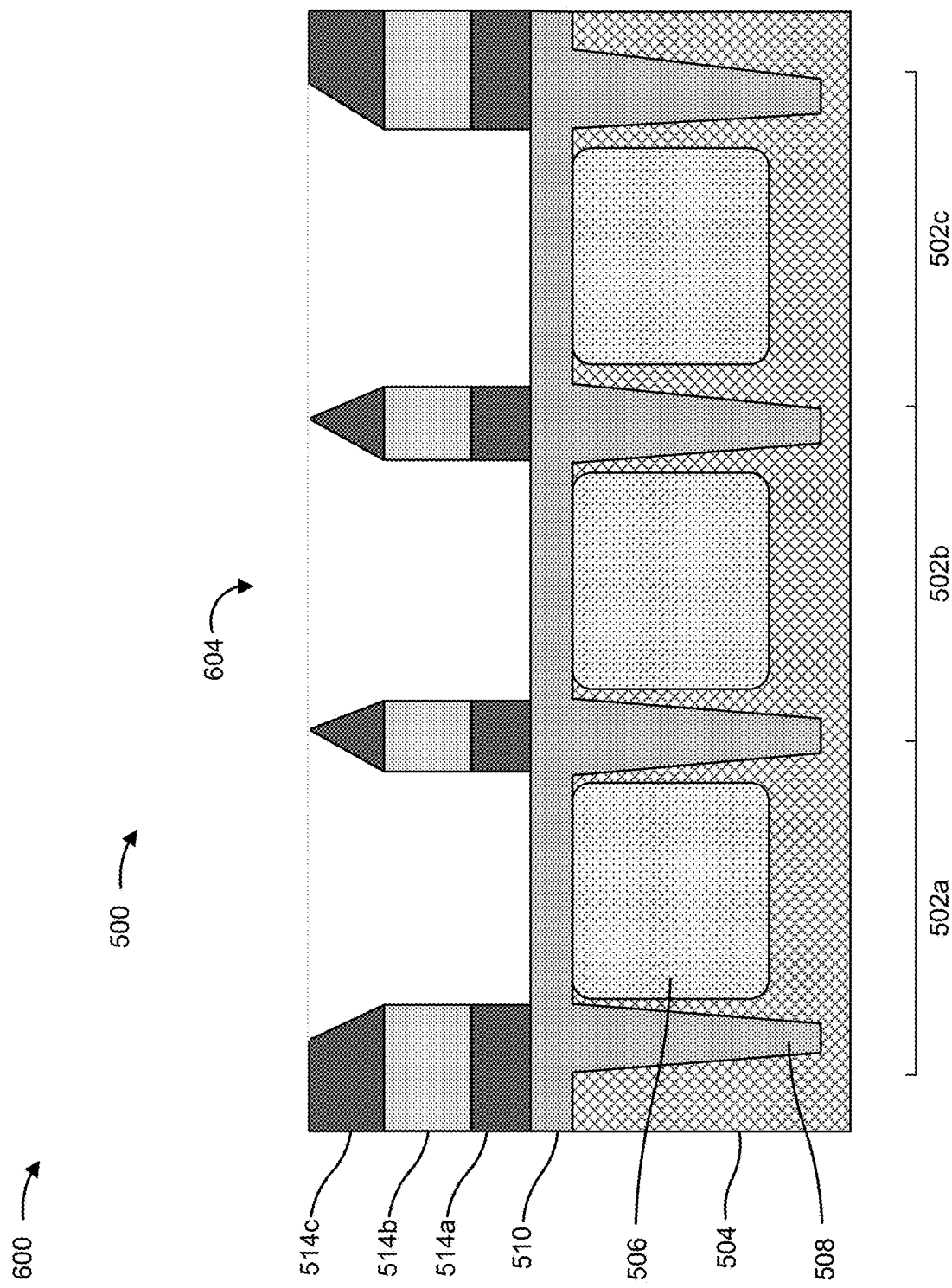

As shown in FIG. 6G, the remaining portions of the pattern layer 602 may be removed from the dielectric layer 514c. Various techniques may be used to remove the pattern layer 602, such as selective etching, ashing (e.g., plasma ashing), and/or photoresist stripping, among other examples.

Figure 6H:
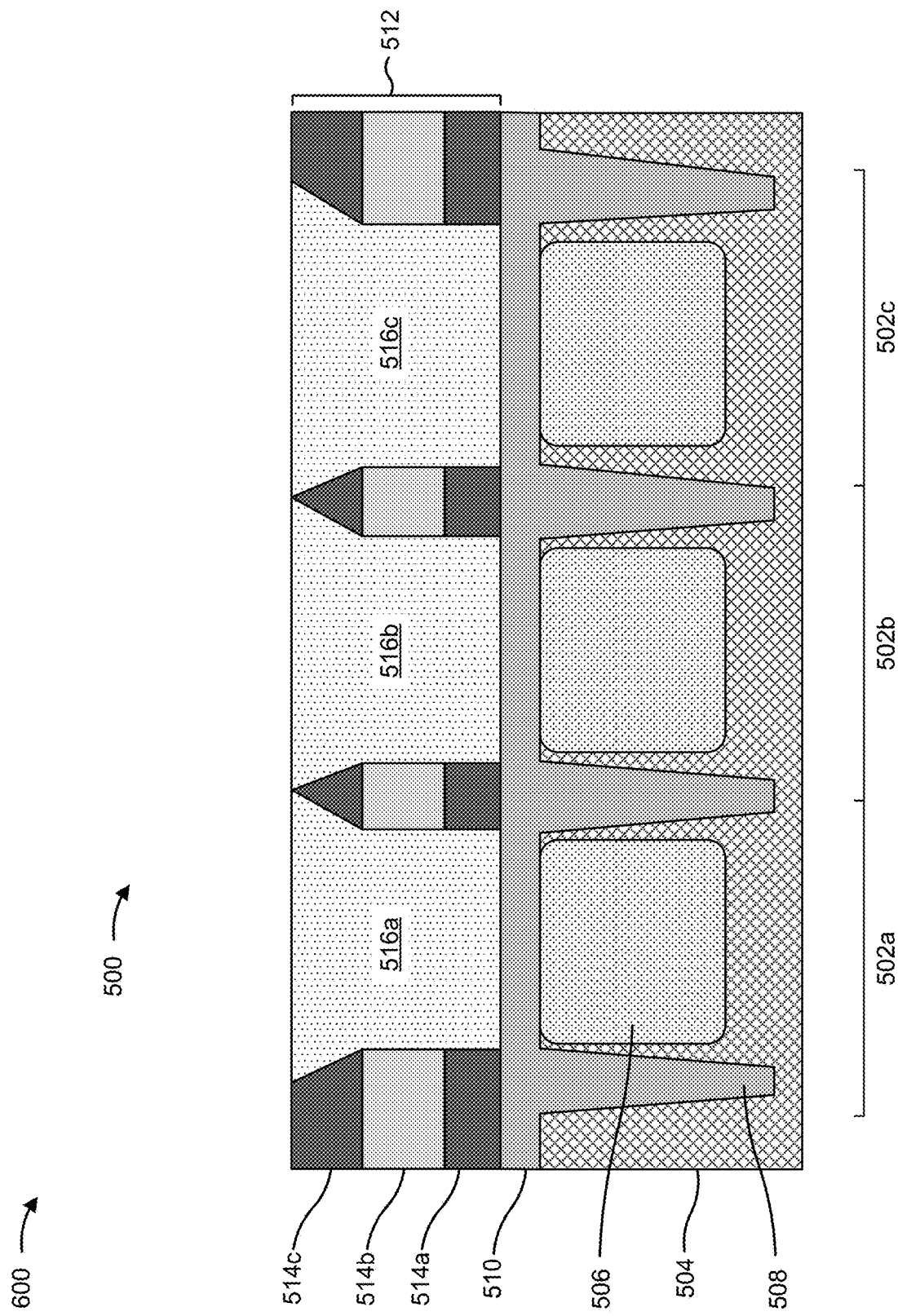

As shown in FIG. 6H, respective color filter regions 516 may be formed for each of the pixel sensors 502 in the pixel array 500 in the openings 604 in between the grid structure 512. For example, the color filter region 516a may be formed in an opening 604 above the photodiode 506 for the pixel sensor 502a, a color filter region 516b may be formed in an opening 604 above the photodiode 506 for the pixel sensor 502b, a color filter region 516c may be formed in an opening 604 above the photodiode 506 for the pixel sensor 502c, and so on. Each color filter region 516 may be formed in between the grid structure 512 to reduce color mixing between adjacent pixel sensors 502. A semiconductor processing tool (e.g., the deposition tool 102) may deposit the color filter regions 516 using various PVD techniques, CVD techniques and/or ALD techniques, such as sputtering, PECVD, HDP-CVD, SACVD, or PEALD. The color filter regions 516 may conform to the angled or tapered sidewall portion and to the approximately straight sidewall portion of the grid structure 512.

Figure 6I:
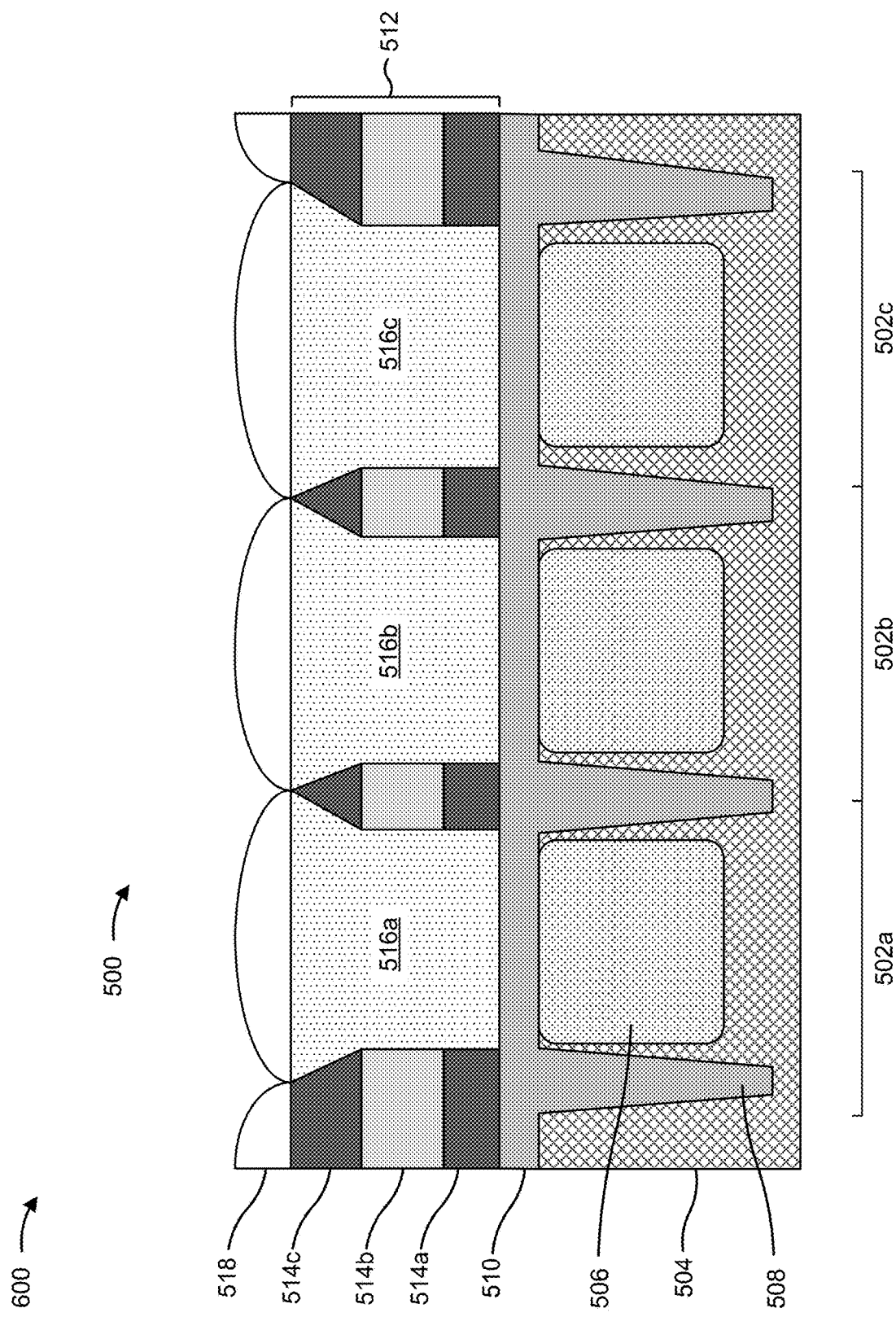

As shown in FIG. 6I, the micro-lens layer 518 including a plurality of micro-lenses is formed over and/or on the color filter regions 516. The micro-lens layer 518 may include a respective micro-lens for each of the pixel sensors 502 included in the pixel array 500. For example, a micro-lens may be formed over and/or on the color filter region 516a of the pixel sensor 502a, a micro-lens may be formed over and/or on the color filter region 516b of the pixel sensor 502b, a micro-lens may be formed over and/or on the color filter region 516c of the pixel sensor 502c, and so on.

As indicated above, FIGS. 6A-6I are provided as an example. Other examples may differ from what is described with regard to FIGS. 6A-6I.

Figure 7:
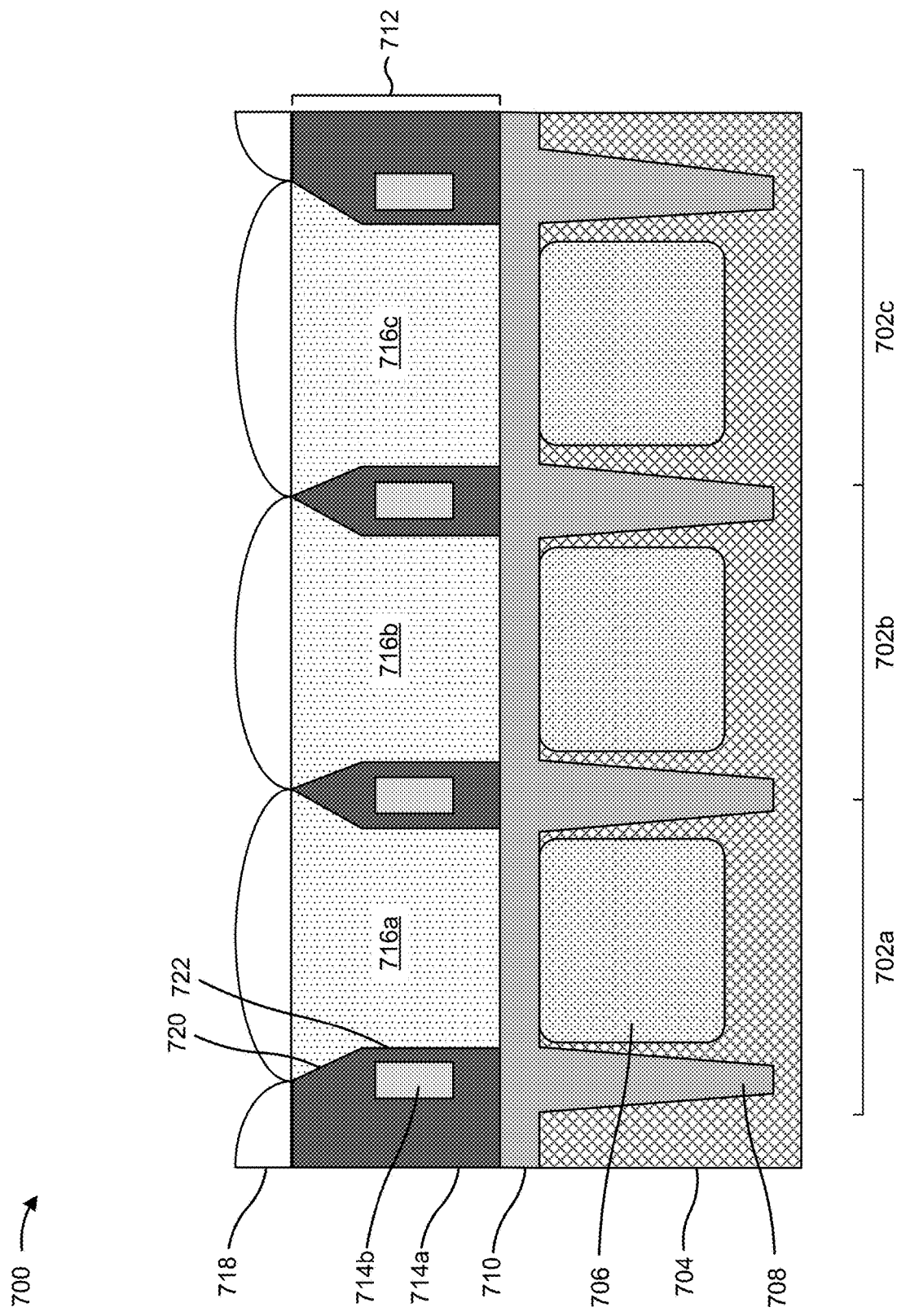
FIGS. 7-9 are diagrams of example pixel arrays described herein.

FIG. 7 is a diagram of an example pixel array 700 described herein. The pixel array 700 may be similar to the pixel array 500 and may include similar layers and/or structures. However, the pixel array 700 includes a grid structure that is formed in a dielectric layer that includes a plurality of metal layer portions. The plurality of metal layer portions may increase optical crosstalk performance of an oxide metal grid including the dielectric layer.

In some implementations, the example pixel array 700 illustrated in FIG. 7 may include, or may be included in, the pixel array 200 (or a portion thereof). In some implementations, the pixel array 700 may be included in an image sensor. The image sensor may include a CMOS image sensor, an FSI CMOS image sensor, a BSI CMOS image sensor, or another type of image sensor.

As shown in FIG. 7, the pixel array 700 may include a plurality of adjacent pixel sensors 702 formed in a substrate 704, such as pixel sensors 702a-702c. Each pixel sensor 702 may include a photodiode 706. An isolation structure 708 may be included in the substrate 704 between adjacent pixel sensors 702 and filled with an oxide layer 710. The oxide layer 710 may also be included over and/or on the top surface of the substrate 704 and over the photodiodes 706.

A grid structure 712 may be included over and/or on the oxide layer 710 and may surround the perimeters of the pixel sensors 702. The grid structure 712 may include a plurality of grid layers over and/or on the oxide layer 710, including a dielectric layer 714a and a plurality of metal layer portions 714b. The metal layer portions 714b may be formed by forming a first portion of the dielectric layer 714a, forming a metal layer over and/or on the first portion of the dielectric layer 714a, etching through the metal layer to form the plurality of metal layer portions 714b, and forming a second portion of the dielectric layer 714a in between the plurality of metal layer portions 714b and over and/or on the plurality of metal layer portions 714b. The plurality of metal layer portions 714b may increase optical crosstalk performance of an oxide metal grid including the dielectric layer 714.

Respective color filter regions 716 may be included in the areas between the grid structure 712. For example, a color filter region 716a may be formed in between columns of the grid structure 712 over the photodiode 706 of the pixel sensor 702a, a color filter region 716b may be formed in between columns of the grid structure 712 over the photodiode 706 of the pixel sensor 702b, a color filter region 716c may be formed in between columns of the grid structure 712 over the photodiode 706 of the pixel sensor 702c, and so on. A micro-lens layer 718 may be included above and/or on the color filter regions 716. The micro-lens layer 718 may include a respective micro-lens for each of the pixel sensors 702. For example, a micro-lens may be formed to focus incident light toward the photodiode 706 of the pixel sensor 702a, another micro-lens may be formed to focus incident light toward the photodiode 706 of the pixel sensor 702b, another micro-lens may be formed to focus incident light toward the photodiode 706 of the pixel sensor 702c, and so on.

The grid structure 712 may include an angled section 720 that includes angled or tapered sidewalls, and an approximately straight section 722 that includes approximately straight sidewalls. The color filter regions 716 may be filled in between the grid structure 712 such that the color filter regions 716 conform to the angled or tapered sidewalls of the grid structure 712 in the angled section 720, and conform to the approximately straight sidewalls in the approximately straight section 722. Accordingly, the sidewalls of the color filter regions 716 may be inversely angled or tapered relative to the sidewalls of the grid structure 712 in the angled section 720 in that the sidewalls of the color filter regions 716 may taper or converge inward (e.g., toward a center of the color filter regions 716) from near the top surfaces of the color filter regions 716 to a portion of a depth of the color filter regions 716. Moreover, the sidewalls of the color filter regions 716 may be approximately straight through the approximately straight section 722 of the grid structure 712.

As indicated above, FIG. 7 is provided as an example. Other examples may differ from what is described with regard to FIG. 7.

Figure 8:
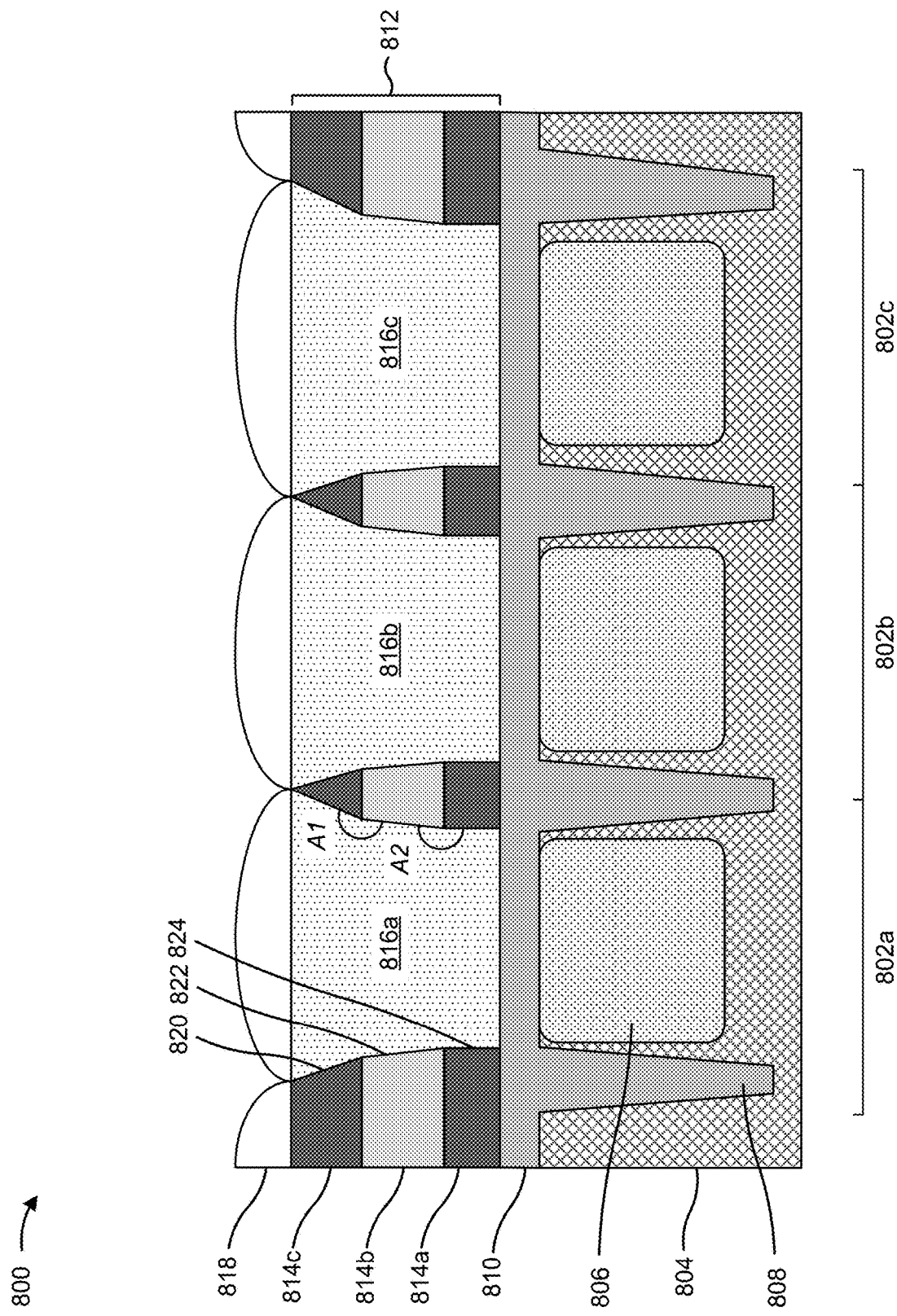

FIG. 8 is diagram of an example pixel array 800 described herein. The pixel array 800 may be similar to the pixel array 500 and may include similar layers and/or structures. However, the pixel array 800 includes a plurality of angled or tapered sections in the plurality of grid layers. In the pixel array 800, the dielectric layers may be stacked over the metal layer. The dielectric layers may have different etch rates. The different etch rates of the dielectric layers, and the etch rate of the metal layer may result in the grid structure including a first angled or tapered section, a second angled or tapered section below the first angled or tapered section, and an approximately straight section below the second angled or tapered section.

In some implementations, the example pixel array 800 illustrated in FIG. 8 may include, or may be included in, the pixel array 200 (or a portion thereof). In some implementations, the pixel array 800 may be included in an image sensor. The image sensor may include a CMOS image sensor, an FSI CMOS image sensor, a BSI CMOS image sensor, or another type of image sensor.

As shown in FIG. 8, the pixel array 800 may include a plurality of adjacent pixel sensors 802 formed in a substrate 804, such as pixel sensors 802a-802c. Each pixel sensor 802 may include a photodiode 806. An isolation structure 808 may be included in the substrate 804 between adjacent pixel sensors 802 and filled with an oxide layer 810. The oxide layer 810 may also be included over and/or on the top surface of the substrate 804 and over the photodiodes 806.

A grid structure 812 may be included over and/or on the oxide layer 810 and may surround the perimeters of the pixel sensors 802. The grid structure 812 may include a plurality of grid layers over and/or on the oxide layer 810, including a metal layer 814a, a dielectric layer 814b, and another dielectric layer 814c. The metal layer 814a may be included over and/or on the oxide layer 810, the dielectric layer 814b may be included over and/or on the metal layer 814*a*, and the dielectric layer 814*c* may be included over and/or on the dielectric layer 814*b*.

Respective color filter regions 816 may be included in the areas between the grid structure 812. For example, a color filter region 816*a* may be formed in between columns of the grid structure 812 over the photodiode 806 of the pixel sensor 802*a*, a color filter region 816*b* may be formed in between columns of the grid structure 812 over the photodiode 806 of the pixel sensor 802*b*, a color filter region 816*c* may be formed in between columns of the grid structure 812 over the photodiode 806 of the pixel sensor 802*c*, and so on. A micro-lens layer 818 may be included above and/or on the color filter regions 816. The micro-lens layer 818 may include a respective micro-lens for each of the pixel sensors 802. For example, a micro-lens may be formed to focus incident light toward the photodiode 806 of the pixel sensor 802*a*, another micro-lens may be formed to focus incident light toward the photodiode 806 of the pixel sensor 802*b*, another micro-lens may be formed to focus incident light toward the photodiode 806 of the pixel sensor 802*c*, and so on.

As described above, the grid structure 812 may include a plurality of angled or tapered sections, such as an angled section 820 and an angled section 822, and an approximately straight section 824. In the angled sections 820 and 822, the sidewalls of the grid structure 812 may be angled relative to the top surface of the oxide layer 810 and relative to the top surface of the grid structure 812 (e.g., at a non-90-degree angle or a non-perpendicular angle) such that the sidewalls of the grid structure 812 taper or converge through a portion of the grid structure 812. For example, the sidewalls of the grid structure may be angled such that the grid structure 812 is tapered in the angled section 820 (which may be included in the dielectric layer 814*c*), and may be angled such that the grid structure 814 is tapered in the angled section 822 (which may be included in the dielectric layer 814*b*). The sidewalls of the grid structure 812 may transition from the angled section 822 to the approximately straight section 824 downward toward the bottom of the grid structure 812 (and downward toward the oxide layer 810) in the metal layer 814*a*. The approximately straight section may include a section of the grid structure 812 that is approximately 90 degrees (or at an approximately perpendicular angle) relative to the top surface of the oxide layer 810.

The sidewalls of the grid structure 812 may transition between the angled section 820 and the angled section 822 at a transition angle (A1). The sidewalls of the grid structure 812 may transition between the angled section 822 and the approximately straight section 824 at a transition angle (A2). In some implementations, the transition angle (A1) and the transition angle (A2) are approximately equal (e.g., are approximately the same angle). In some implementations, the transition angle (A1) and the transition angle (A2) are different transition angles. In some implementations, the transition angle (A1) and the transition angle (A2) may each range from greater than 180 degrees to less than or equal to approximately 225 degrees.

The angled sections 820 and 822, and the approximately straight section 824, may be formed by etching (e.g., using the etch tool 108) through the dielectric layer 814*c* such that the sidewalls of the grid structure 812 are angled in the angled section 820 from the top surface of the grid structure 812 to the dielectric layer 814*b*, etching (e.g., using the etch tool 108) through the dielectric layer 814*b* such that the sidewalls of the grid structure are angled in the angled section 822 from the dielectric layer 814*c* to the metal layer 814*a*, and etching (e.g., using the etch tool 108) through the metal layer 814*a* such that the sidewalls of the grid structure are approximately straight through the metal layer 814*a* in approximately straight section 824.

The color filter regions 816 may be filled in between the grid structure 812 such that the color filter regions 816 conform to the sidewalls of the grid structure 812 in the angled section 820, in the angled section 822, and in the approximately straight section 824. Accordingly, the sidewalls of the color filter regions 816 may be inversely angled or tapered relative to the sidewalls of the grid structure 812 in the angled sections 820 and 822. Moreover, the sidewalls of the color filter regions 816 may be approximately straight through the approximately straight section 824 of the grid structure 812.

As indicated above, FIG. 8 is provided as an example. Other examples may differ from what is described with regard to FIG. 8.

Figure 9:
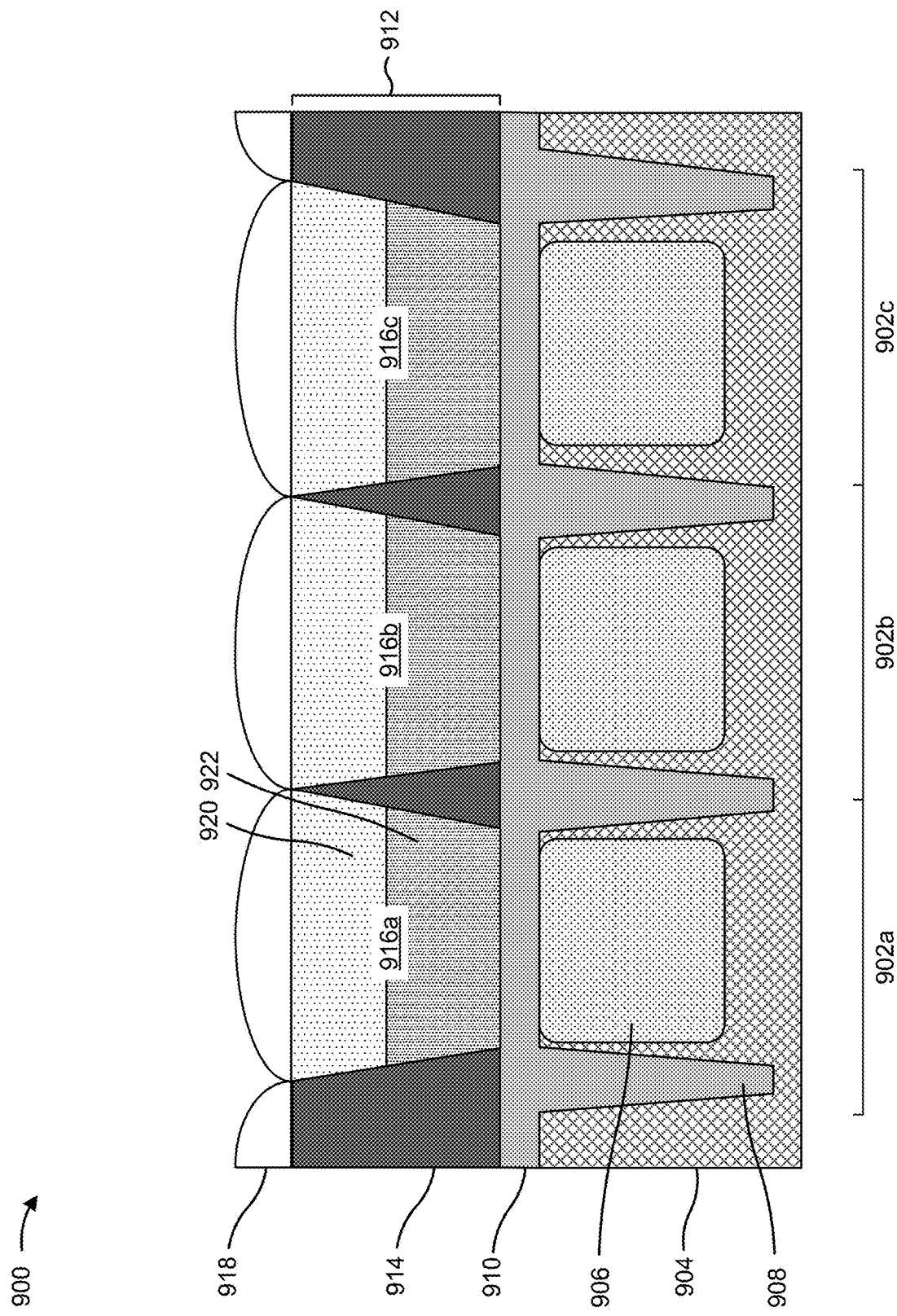

FIG. 9 is a diagram of an example pixel array 900 described herein. The pixel array 900 may be similar to the pixel array 300 and may include similar layers and/or structures. However, color filter regions included in the pixel array 900 are composed of a plurality of color filter layers. Each of the color filter layers may be configured to filter a particular wavelength of incident light. The combination of color filter layers in a color filter region in the pixel array 900 may be configured to permit a particular wavelength of incident light to pass through the color filter region to define a red pixel sensor, a green pixel sensor, a blue pixel sensor, or another type of pixel sensor. The example color filter region configuration illustrated in FIG. 9 may be included in other pixel arrays describe herein, such as the pixel array 300, the pixel array 500, the pixel array 700, and/or the pixel array 800.

In some implementations, the example pixel array 900 illustrated in FIG. 9 may include, or may be included in, the pixel array 200 (or a portion thereof). In some implementations, the pixel array 900 may be included in an image sensor. The image sensor may include a CMOS image sensor, an FSI CMOS image sensor, a BSI CMOS image sensor, or another type of image sensor.

As shown in FIG. 9, the pixel array 900 may include a plurality of adjacent pixel sensors 902 formed in a substrate 904, such as pixel sensors 902*a*-902*c*. Each pixel sensor 902 may include a photodiode 906. An isolation structure 908 may be included in the substrate 904 between adjacent pixel sensors 902 and filled with an oxide layer 910. The oxide layer 910 may also be included over and/or on the top surface of the substrate 904 and over the photodiodes 906. A grid structure 912 may be included over and/or on the oxide layer 910 and may surround the perimeters of the pixel sensors 902. The grid structure 912 may include a dielectric layer 914.

Respective color filter regions 916 may be included in the areas between the grid structure 912. For example, a color filter region 916*a* may be formed in between columns of the grid structure 912 over the photodiode 906 of the pixel sensor 902*a*, a color filter region 916*b* may be formed in between columns of the grid structure 912 over the photodiode 906 of the pixel sensor 902*b*, a color filter region 916*c* may be formed in between columns of the grid structure 912 over the photodiode 906 of the pixel sensor 902*c*, and so on. A micro-lens layer 918 may be included above and/or on the color filter regions 916. The micro-lens layer 918 may include a respective micro-lens for each of the pixel sensors 902. For example, a micro-lens may be formed to focus incident light toward the photodiode 906 of the pixel sensor 902a, another micro-lens may be formed to focus incident light toward the photodiode 906 of the pixel sensor 902b, another micro-lens may be formed to focus incident light toward the photodiode 906 of the pixel sensor 902c, and so on.

As further shown in FIG. 9 the sidewalls of the grid structure 912 may be angled relative to the top surface of the oxide layer 910 (e.g., at a non-90-degree angle or a non-perpendicular angle) such that the sidewalls of the grid structure 912 taper or converge from a bottom surface of the grid structure 912 to a top surface of the grid structure 912. The taper between the bottom surface of the grid structure 912 and the top surface of the grid structure 912 may be continuous and gradual such that the sidewalls are approximately straight (e.g., as opposed to including breaks, curves, or direction changes) and such that the taper is uniform from the bottom surface of the grid structure 912 to the top surface of the grid structure 912. Thus, the bottom surface of the grid structure 912 is wider relative to the top surface of the grid structure 912.

The color filter regions 916 may be filled in between the grid structure 912 such that the color filter regions 916 conform to the angled or tapered sidewalls of the grid structure 912. Accordingly, the sidewalls of the color filter regions 916 may be inversely angled or tapered relative to the sidewalls of the grid structure 912 in that the sidewalls of the color filter regions 916 may taper or converge inward (e.g., toward a center of the color filter regions 916) from near the top surfaces of the color filter regions 916 to near the bottom surfaces of the color filter regions 916. Thus, the widths of the color filter regions 916 at and/or near the bottom surfaces of the color filter regions 916 may be greater relative to the widths of the color filter regions 916 at and/or near the top surfaces of the color filter regions 916.

As further shown in FIG. 9, color filter regions 916 may include a plurality of color filter layers, such as a color filter layer 920 and a color filter layer 922, among other examples. The color filter layers 920 and 922 may each be configured to filter incident light in a particular wavelength range such that the combination of the color filter layers 920 and 922 permit incident light in another wavelength range to pass through the color filter region 916 and to the associated photodiode 906. As an example, a color filter layer 920 may be configured to filter out incident light in a wavelength range associated with blue light, and a color filter layer 922 may be configured to filter out incident light in a wavelength range associated with green light, such that only incident light in a wavelength range associated with red light is permitted to pass (e.g., to define a red pixel sensor).

As indicated above, FIG. 9 is provided as an example. Other examples may differ from what is described with regard to FIG. 9.

Figure 10:
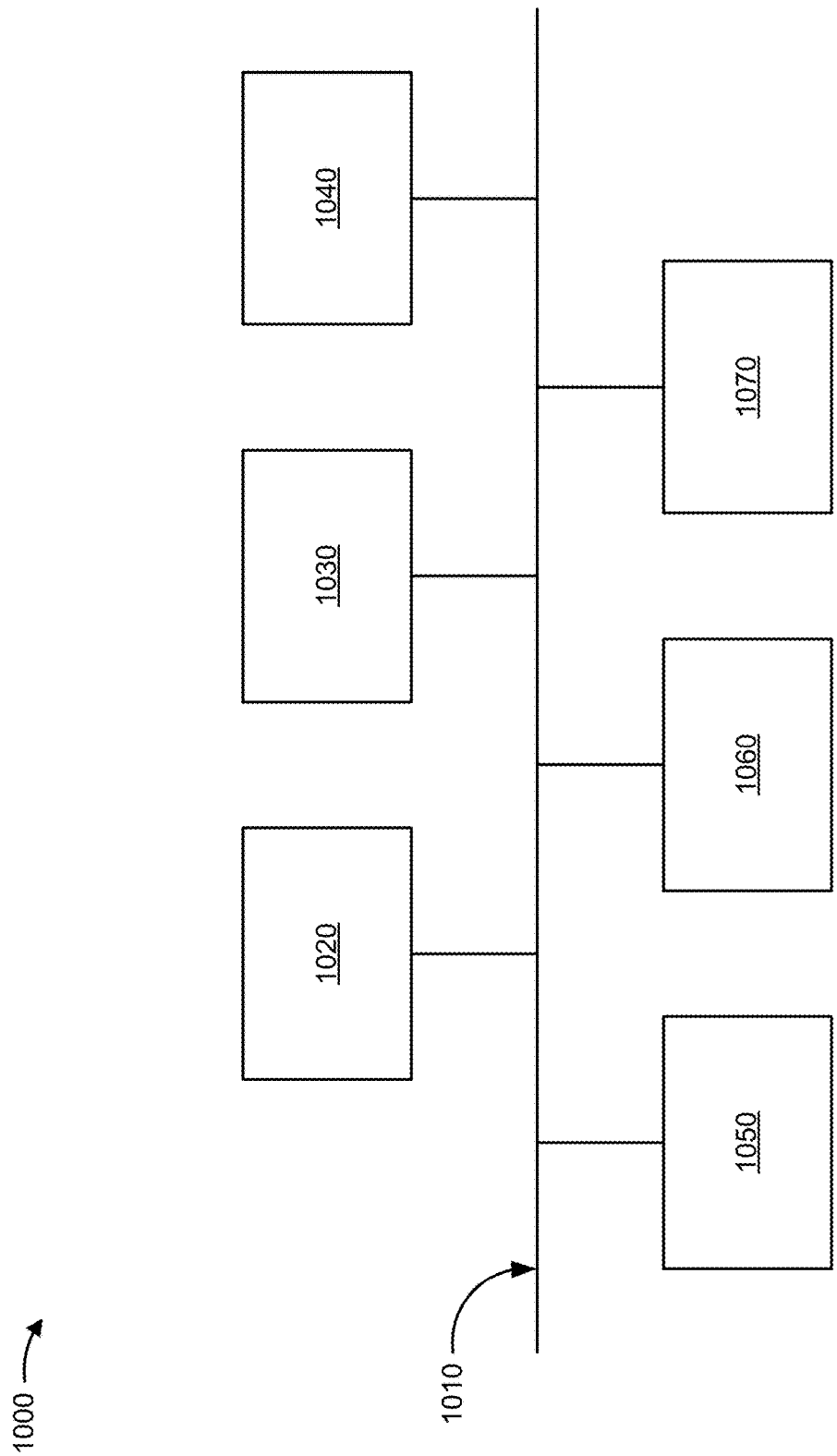
FIG. 10 is a diagram of example components of one or more devices of FIG. 1 described herein.

FIG. 10 is a diagram of example components of a device 1000. In some implementations, one or more of the semiconductor processing tool 102-114 and/or the wafer/die transport tool 116 may include one or more devices 1000 and/or one or more components of device 1000. As shown in FIG. 10, device 1000 may include a bus 1010, a processor 1020, a memory 1030, a storage component 1040, an input component 1050, an output component 1060, and a communication component 1070.

Bus 1010 includes a component that enables wired and/or wireless communication among the components of device 1000. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform a function. Memory 1030 includes a random access memory, a read only memory, and/or another type of memory (e.g., a flash memory, a magnetic memory, and/or an optical memory).

Storage component 1040 stores information and/or software related to the operation of device 1000. For example, storage component 1040 may include a hard disk drive, a magnetic disk drive, an optical disk drive, a solid state disk drive, a compact disc, a digital versatile disc, and/or another type of non-transitory computer-readable medium. Input component 1050 enables device 1000 to receive input, such as user input and/or sensed inputs. For example, input component 1050 may include a touch screen, a keyboard, a keypad, a mouse, a button, a microphone, a switch, a sensor, a global positioning system component, an accelerometer, a gyroscope, and/or an actuator. Output component 1060 enables device 1000 to provide output, such as via a display, a speaker, and/or one or more light-emitting diodes. Communication component 1070 enables device 1000 to communicate with other devices, such as via a wired connection and/or a wireless connection. For example, communication component 1070 may include a receiver, a transmitter, a transceiver, a modem, a network interface card, and/or an antenna.

Device 1000 may perform one or more processes described herein. For example, a non-transitory computer-readable medium (e.g., memory 1030 and/or storage component 1040) may store a set of instructions (e.g., one or more instructions, code, software code, and/or program code) for execution by processor 1020. Processor 1020 may execute the set of instructions to perform one or more processes described herein. In some implementations, execution of the set of instructions, by one or more processors 1020, causes the one or more processors 1020 and/or the device 1000 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

FIG. 11 is a flowchart of an example process 1100 associated with forming a pixel array. In some implementations, one or more process blocks of FIG. 11 may be performed by a one or more semiconductor processing tools (e.g., one or more semiconductor processing tools 102-114). Additionally, or alternatively, one or more process blocks of FIG. 11 may be performed by one or more components of device 1000, such as processor 1020, memory 1030, storage component 1040, input component 1050, output component 1060, and/or communication component 1070.

As shown in FIG. 11, process 1100 may include forming one or more grid layers over a plurality of photodiodes in a pixel array (block 1110). For example, the one or more semiconductor processing tools 102-114 may form one or more grid layers (e.g., the layers 314, 514, 714, 814, and/or 914) over a plurality of photodiodes (e.g., the photodiode 306, 506, 706, 806, and/or 906) in a pixel array (e.g., the pixel array 200, 300, 500, 700, 800, and/or 900), as described above.

As further shown in FIG. 11, process 1100 may include forming a pattern layer over the one or more grid layers (block 1120). For example, the one or more semiconductor processing tools 102-114 may form a pattern layer (e.g., the pattern layer 402 and/or 602) over the one or more grid layers, as described above.

As further shown in FIG. 11, process 1100 may include forming a pattern in the pattern layer (block 1130). For example, the one or more semiconductor processing tools 102-114 may form a pattern in the pattern layer, as described above.

As further shown in FIG. 11, process 1100 may include etching through the one or more grid layers to an oxide layer, based on the pattern, to form a grid structure above the plurality of photodiodes, where over-etching near a top surface of the one or more grid layers results in at least one section of the grid structure having sidewalls that are at least partially angled (block 1140). For example, the one or more semiconductor processing tools 102-114 may etch through the one or more grid layers to an oxide layer (e.g., the oxide layer 310, 510, 710, 810, and/or 910), based on the pattern, to form a grid structure (e.g., the grid structure 312, 512, 712, 812, and/or 912) above the plurality of photodiodes, as described above. In some implementations, over-etching near a top surface of the one or more grid layers results in at least one section of the grid structure (e.g., the entire grid structure 312, the angled section 532, the angled section 720, the angled section 820, the angled section 822, and/or the entire grid structure 912) having sidewalls (e.g., the sidewalls 330 and/or 524) that are at least partially angled.

As further shown in FIG. 11, process 1100 may include forming a plurality of color filter regions over the plurality of photodiodes and in openings between the grid structure (block 1150). For example, the one or more semiconductor processing tools 102-114 may form a plurality of color filter regions (e.g., the color filter regions 316, 516, 716, 816, and/or 916) over the plurality of photodiodes and in openings (e.g., the openings 404 and/or 604) between the grid structure, as described above.

Process 1100 may include additional implementations, such as any single implementation or any combination of implementations described below and/or in connection with one or more other processes described elsewhere herein.

In a first implementation, etching through the one or more grid layers includes etching through a dielectric layer (e.g., the dielectric layer 314 and/or 914), of the one or more grid layers, such that the at least one section of the grid structure having sidewalls that are at least partially angled extends from a top surface (e.g., the top surface 326) of the grid structure to a bottom surface (e.g., the bottom surface 328) of the grid structure. In a second implementation, alone or in combination with the first implementation, etching through the one or more grid layers includes etching through a dielectric layer (e.g., the dielectric layer 514c, 714a, 814c, and/or 814b), of the one or more grid layers, such that the at least one section of the grid structure having sidewalls that are at least partially angled extends from a top surface (e.g., the top surface 528) of the grid structure to a metal layer (e.g., the metal layer 514b and/or 814a), of the one or more grid layers, below the dielectric layer. In a third implementation, alone or in combination with one or more of the first and second implementations, process 1100 includes etching through the metal layer such that another section (e.g., the section 534, 722, and/or 824) of the grid structure includes approximately straight sidewalls.

In a fourth implementation, alone or in combination with one or more of the first through third implementations, the at least one section of the grid structure includes a first section (e.g., the tapered section 820) and a second section (e.g., the tapered section 822), and etching through the one or more grid layers includes etching through a first dielectric layer (the dielectric layer 814c), of the one or more grid layers, such that the sidewalls are angled in the first section from a top surface (e.g., the top surface 528) of the grid structure to a second dielectric layer (e.g., the dielectric layer 814b), of the one or more grid layers, below the first dielectric layer, etching through the second dielectric layer such that the sidewalls are angled in the second section from the first dielectric layer to a metal layer (e.g., the metal layer 814a), of the one or more grid layers, below the second dielectric layer, and etching through the metal layer such that the sidewalls are approximately straight through the metal layer in a third section (e.g., the section 824) of the grid structure. In a fifth implementation, alone or in combination with one or more of the first through fourth implementations, forming the one or more grid layers includes forming a dielectric layer (e.g., the dielectric layer 704a), and forming a plurality of metal layer portions (e.g., metal layer portions 714b) in the dielectric layer.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, a grid structure in a pixel array may be at least partially angled or tapered toward a top surface of the grid structure such that the width of the grid structure approaches a near-zero width near the top surface of the grid structure. This permits the spacing between color filter regions in between the grid structure to approach a near-zero spacing near the top surfaces of the color filter regions, which reduces and/or minimizes the spacing between color filter regions near the top surfaces of the color filter regions. The tight spacing of color filter regions provided by the angled or tapered grid structure provides a greater surface area and volume for incident light collection in the color filter regions, which may increase the quantum efficiency of the pixel array. Moreover, the width of the grid structure may increase at least partially toward a bottom surface of the grid structure such that the wider dimension of the grid structure near the bottom surface of the grid structure provides optical crosstalk protection for the pixel sensors in the pixel array.

As described in greater detail above, some implementations described herein provide a pixel sensor. The pixel sensor includes a photodiode. The pixel sensor includes a grid structure above the photodiode. The pixel sensor includes a color filter region over the photodiode and in between sidewalls of the grid structure, where sidewalls of the color filter region are angled from a top surface of the color filter region to a bottom surface of the color filter region such that a width of the top surface of the color filter region is greater relative to a width of the bottom surface of the color filter region.

As described in greater detail above, some implementations described herein provide a method. The method includes forming one or more grid layers over a plurality of photodiodes in a pixel array. The method includes forming a pattern layer over the one or more grid layers. The method includes forming a pattern in the pattern layer. The method includes etching through the one or more grid layers to an oxide layer, based on the pattern, to form a grid structure above the plurality of photodiodes, where over-etching near a top surface of the one or more grid layers results in at least one section of the grid structure having sidewalls that are at least partially angled. The method includes forming a plurality of color filter regions over the plurality of photodiodes and in openings between the grid structure.

As described in greater detail above, some implementations described herein provide a pixel array. The pixel array includes a plurality of photodiodes. The pixel array includes a grid structure, above the plurality of photodiodes, including an approximately straight section and an angled section above the approximately straight section, where a width of a bottom surface of the grid structure is greater relative to a width of a top surface of the grid structure. The pixel array includes respective color filter regions over each of the plurality of photodiodes and in between sidewalls of the grid structure, where sidewalls of the respective color filter regions conform to the sidewalls of the grid structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of grid layers over a plurality of photodiodes in a pixel array, wherein the plurality of grid layers comprises:
        a metal layer;
        a first dielectric layer on the metal layer, and
        a second dielectric layer on first dielectric layer;
    forming a pattern layer over the one or more grid layers;
    forming a pattern in the pattern layer;
    forming a grid structure, above the plurality of photodiodes, comprising:
        a first section, comprising the metal layer, having straight sidewalls,
        a second section, comprising the first dielectric layer and on the first section, having angled sidewalls; and
        a third section, comprising the second dielectric layer and on the second section, having angled sidewalls; and
    forming a plurality of color filter regions over the plurality of photodiodes and in openings in between the grid structure.

2. The method of claim 1, wherein an angle of the angled sidewalls of the first section is greater than an angle of the angled sidewalls of the second section.

3. The method of claim 2, further comprising:
    forming an oxide layer over the plurality of photodiodes.

4. The method of claim 1, further comprising:
    forming a plurality of color filter layers in each of the plurality of color filter regions.

5. The method of claim 1, further comprising:
    forming, in a substrate, the plurality of photodiodes in the pixel array.

6. The method of claim 1, wherein the one or more grid layers comprises one or more dielectric layers.

7. The method of claim 1, wherein an angle of the angled sidewalls of the third section is greater than an angle of the angled sidewalls of the second section.

8. A method, comprising:
    forming a grid structure, above an isolation structure and a plurality of photodiodes, comprises:
        a first section, comprising a metal layer, having straight sidewalls,
        a second section, comprising a first dielectric layer and on the first section, having angled sidewalls, and
        a third section, comprising a second dielectric layer and on the second section, having angled sidewalls;
    forming a plurality of color filter regions in between the grid structure; and
    forming a micro-lens layer over the plurality of color filter regions.

9. The method of claim 8, wherein the plurality of color filter regions are formed over the plurality of photodiodes.

10. The method of claim 8, wherein a width of a top surface of at least one color filter region, of the plurality of color filter regions, is greater than a width of a bottom surface of the at least one color filter region.

11. The method of claim 8, wherein a width of a bottom surface of the second section of the grid structure is greater than a width of a top surface of the first section of the grid structure.

12. The method of claim 8, wherein the micro-lens layer comprises a plurality of micro-lenses over the plurality of color filter regions.

13. The method of claim 8, further comprising:
    forming a plurality of color filter layers in each of the plurality of color filter regions.

14. The method of claim 8, wherein the isolation structure is included between adjacent photodiodes of the plurality of photodiodes.

15. The method of claim 8, wherein an angle of the angled sidewalls of the third section is greater than an angle of the angled sidewalls of the second section.

16. A method, comprising:
    forming a plurality of grid layers over an oxide layer that is over a plurality of photodiodes, wherein the plurality of grid layers comprises:
        a first dielectric layer completely surrounding metal layer portions, and
        a second dielectric layer on the first dielectric layer; and
    forming a plurality of openings in the plurality of grid layers,
        wherein the plurality of openings define a grid structure comprising:
            a first section, comprising the first dielectric layer completely surrounding the metal layer portions, having straight sidewalls, and
            a second section, comprising the second dielectric layer and on the first section, having angled sidewalls.

17. The method of claim 16, wherein the oxide layer is over the plurality of photodiodes.

18. The method of claim 16, wherein the oxide layer at least partially surrounds the plurality of photodiodes.

19. The method of claim 16, further comprising:
    forming a plurality of color filter regions in the plurality of openings.

20. The method of claim 19, wherein the plurality of color filter regions comprises a plurality of color filter layers including a first color filter layer configured to filter out incident light at a first wavelength range, and a second color filter layer configured to filter out incident light at a second wavelength range.

\* \* \* \* \*